(12) United States Patent
Quddus

(10) Patent No.: US 9,000,550 B2
(45) Date of Patent: Apr. 7, 2015

(54) SEMICONDUCTOR COMPONENT AND METHOD OF MANUFACTURE

(75) Inventor: Mohammed Tanvir Quddus, Chandler, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1094 days.

(21) Appl. No.: 12/206,570

(22) Filed: Sep. 8, 2008

(65) Prior Publication Data

US 2010/0059849 A1 Mar. 11, 2010

(51) Int. Cl.
| | |
|---|---|
| H01L 29/872 | (2006.01) |
| H01L 21/285 | (2006.01) |
| H01L 27/08 | (2006.01) |
| H01L 27/098 | (2006.01) |
| H01L 29/66 | (2006.01) |
| H01L 29/06 | (2006.01) |

(52) U.S. Cl.
CPC ........ *H01L 29/872* (2013.01); *H01L 21/28537* (2013.01); *H01L 27/0814* (2013.01); *H01L 27/098* (2013.01); *H01L 29/66143* (2013.01); *H01L 29/0649* (2013.01)

(58) Field of Classification Search
USPC ............................ 257/476, E29.338, E21.359
See application file for complete search history.

(56) References Cited

U.S. PATENT DOCUMENTS

| | | | |
|---|---|---|---|
| 4,899,199 A | 2/1990 | Gould | |
| 5,216,275 A | 6/1993 | Chen | |
| 5,418,185 A | 5/1995 | Todd et al. | |
| 5,438,215 A | 8/1995 | Tihanyi | |
| 5,571,738 A | 11/1996 | Krivokapic | |
| 5,859,465 A | 1/1999 | Spring et al. | |
| 5,872,421 A | 2/1999 | Potter | |
| 5,886,383 A | 3/1999 | Kinzer | |
| 5,998,288 A | 12/1999 | Gardner et al. | |
| 6,078,090 A | 6/2000 | Williams et al. | |
| 6,184,555 B1 * | 2/2001 | Tihanyi et al. | ......... 257/342 |
| 6,191,446 B1 | 2/2001 | Gardner et al. | |
| 6,210,999 B1 | 4/2001 | Gardner et al. | |

(Continued)

FOREIGN PATENT DOCUMENTS

| | | |
|---|---|---|
| WO | WO02/19433 A2 | 3/2002 |
| WO | WO2005/096389 A1 | 10/2005 |
| WO | WO2006/025035 A2 | 3/2006 |

OTHER PUBLICATIONS

Semiconductor Components Industries, LLC, "NUF6106FCT1, 6 Channel EMI Pi-Filter Array with ESD Protection", Data Sheet, Mar. 2004—Rev. 0, Publication Order No. NUF6106FC/D.

(Continued)

*Primary Examiner* — Tony Tran
(74) *Attorney, Agent, or Firm* — Rennie William Dover

(57) ABSTRACT

A semiconductor component having a low resistance conduction path and a method for manufacturing the semiconductor component. When the semiconductor component is a Schottky diode, one or more trenches are formed in an epitaxial layer of a first conductivity type that is formed over a semiconductor substrate of the first conductivity type. The trenches may extend into the semiconductor material. Epitaxial semiconductor material of a second conductivity type is selectively grown along the sidewalls of the trenches. An anode contact is formed in contact with the epitaxial layer and the selectively grown epitaxial material and a cathode contact is formed in contact with the semiconductor substrate.

11 Claims, 17 Drawing Sheets

(56) References Cited

U.S. PATENT DOCUMENTS

| | | |
|---|---|---|
| 6,255,152 B1 | 7/2001 | Chen |
| 6,274,904 B1 | 8/2001 | Tihanyi |
| 6,278,165 B1 | 8/2001 | Oowaki et al. |
| 6,355,955 B1 | 3/2002 | Gardner et al. |
| 6,410,955 B1 | 6/2002 | Baker et al. |
| 6,465,869 B2 | 10/2002 | Ahlers et al. |
| 6,479,352 B2 | 11/2002 | Blanchard |
| 6,509,240 B2 | 1/2003 | Ren et al. |
| 6,512,267 B2 | 1/2003 | Kinzer et al. |
| 6,541,817 B1 | 4/2003 | Hurkx et al. |
| 6,576,516 B1 | 6/2003 | Blanchard |
| 6,608,350 B2 | 8/2003 | Kinzer et al. |
| 6,664,590 B2 | 12/2003 | Deboy |
| 6,693,338 B2 | 2/2004 | Saitoh et al. |
| 6,710,418 B1 | 3/2004 | Sapp |
| 6,878,989 B2 | 4/2005 | Izumisawa et al. |
| 6,919,610 B2 | 7/2005 | Saitoh et al. |
| 7,002,187 B1 | 2/2006 | Husher |
| 7,019,377 B2 | 3/2006 | Tsuchiko |
| 7,067,394 B2 | 6/2006 | So |
| 7,176,524 B2 | 2/2007 | Loechelt et al. |
| 7,253,477 B2 | 8/2007 | Loechelt et al. |
| 7,285,823 B2 | 10/2007 | Loechelt et al. |
| 7,411,266 B2 | 8/2008 | Tu et al. |
| 2006/0024890 A1 | 2/2006 | Calafut |
| 2007/0034947 A1 | 2/2007 | Loechelt et al. |
| 2007/0278565 A1 | 12/2007 | Tu et al. |

OTHER PUBLICATIONS

M. Rub, D. Ahlers, J. Baumgartl, G. Deboy, W. Friza, O. Haberlen and I. Steinigke,"A Novel Trench Concept for the Fabrication of Compensation Devices," pp. 203-206., ISPSD 2003, Apr. 14-17, Cambridge, UK.

Deboy, G., et al., "A new Generation of High Voltage MOSFETs Breaks the Limit Line of Silicon", IEDM '98, Dec. 6-9, 1998, p. 683-5.

Lorenz, L, et al., "COOLMOS (TM)—a new Milestone in High Voltage Power MOS", ISPSD '99, May 26-28, 1999, p. 3-10.

* cited by examiner

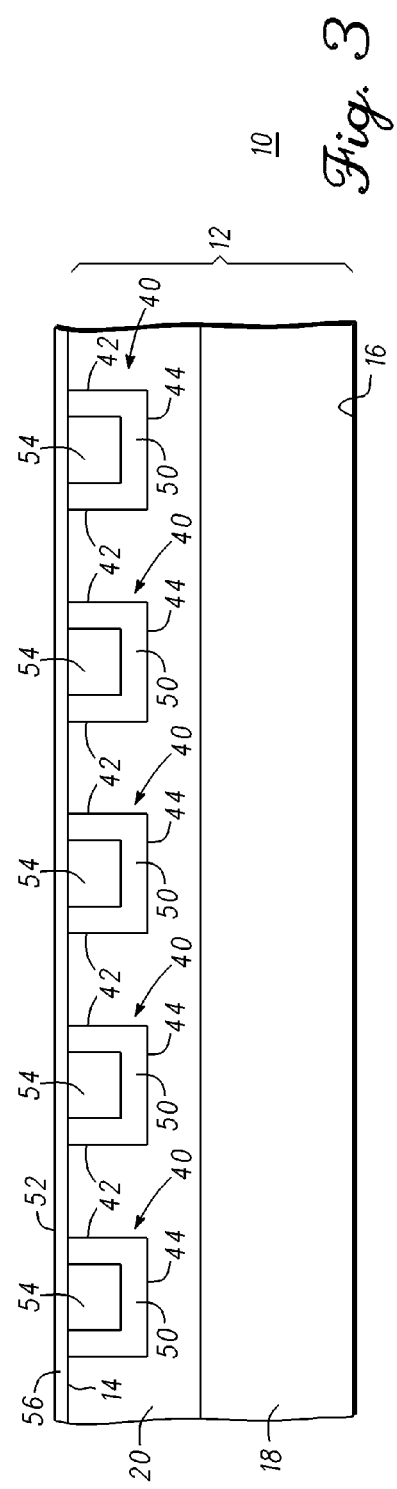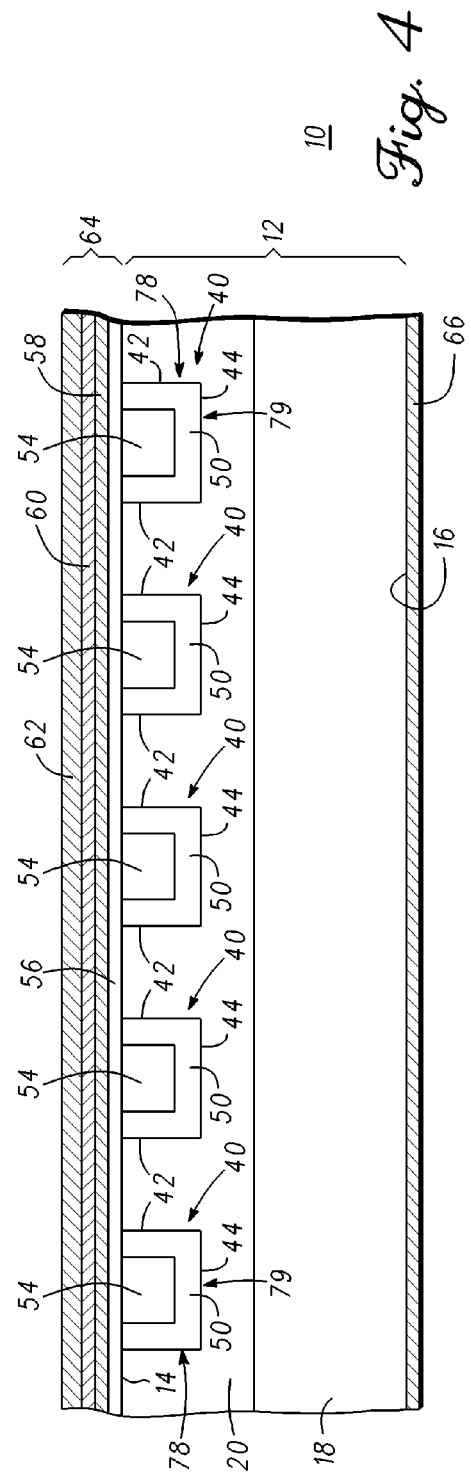

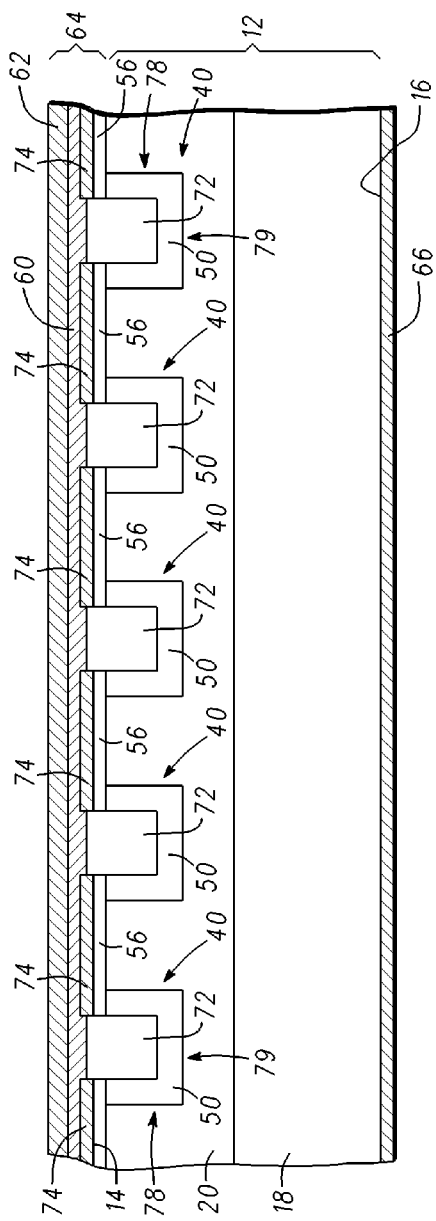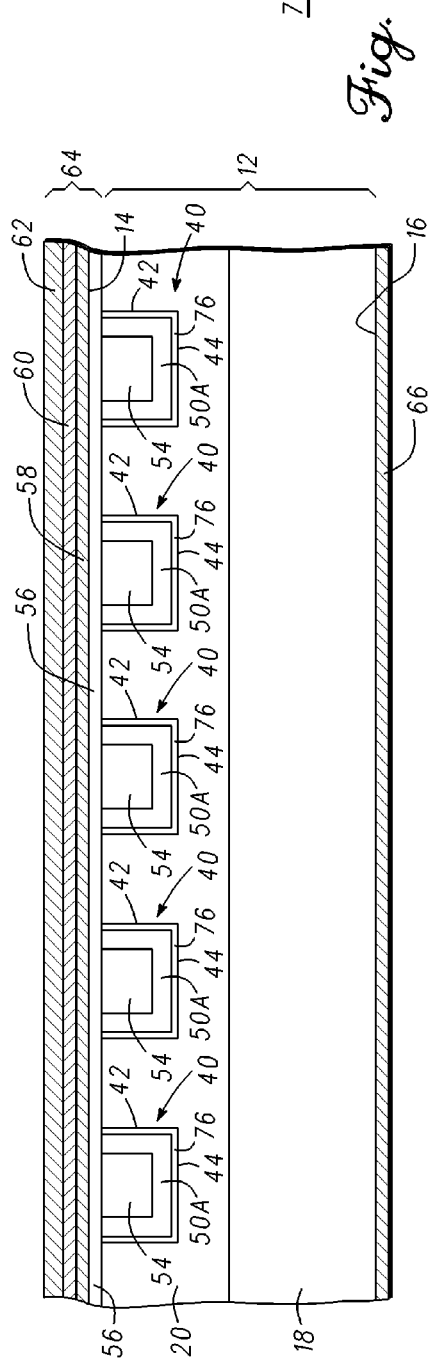

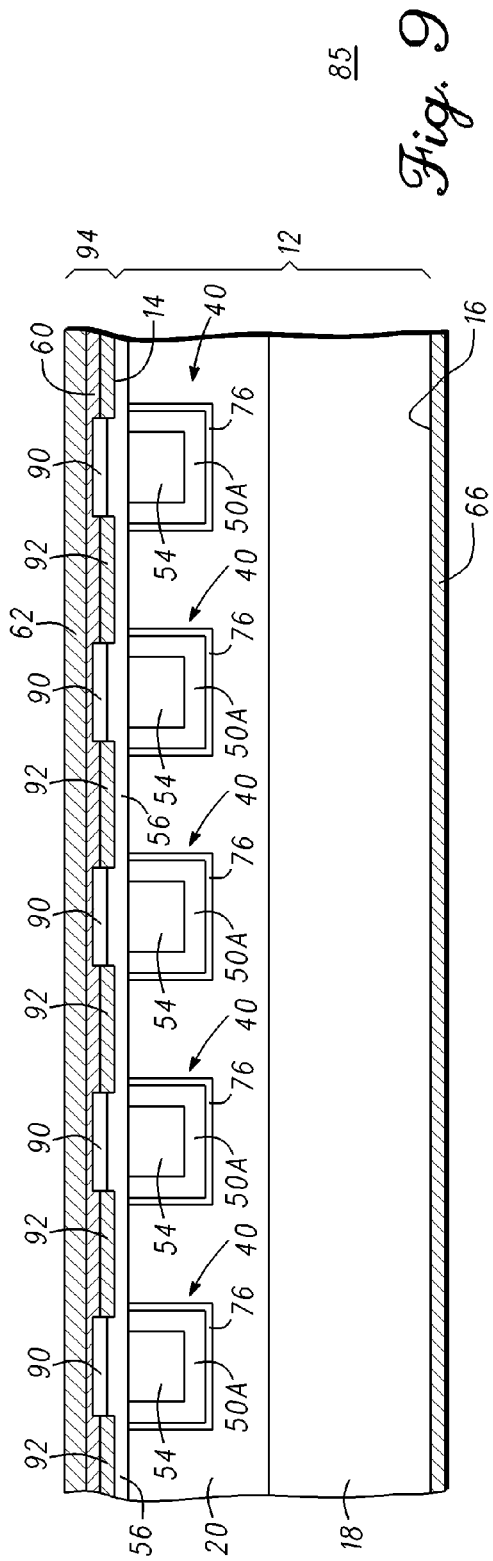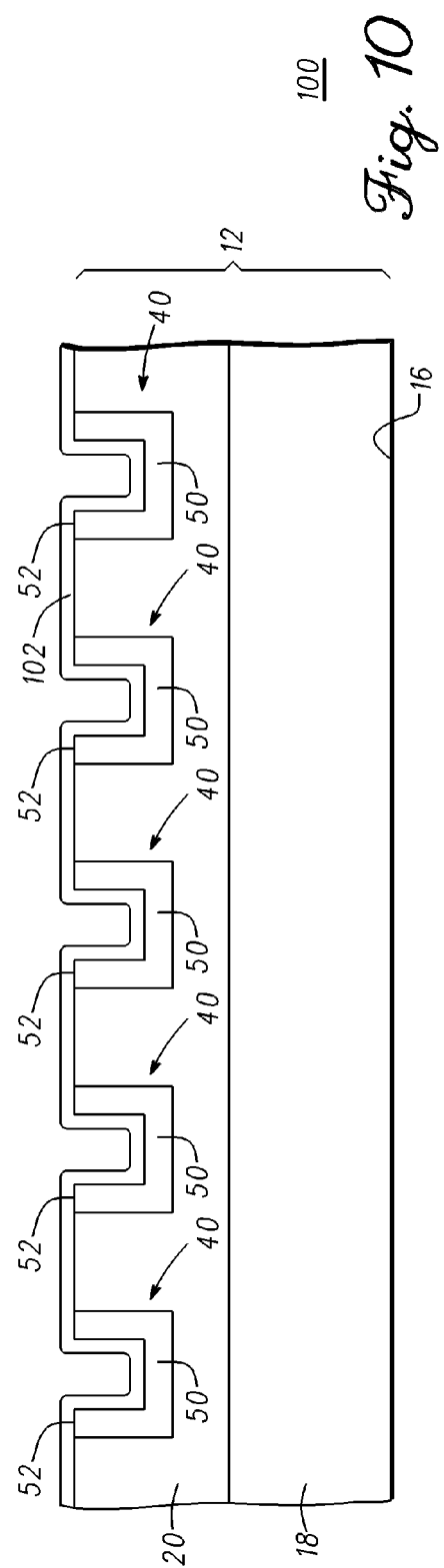

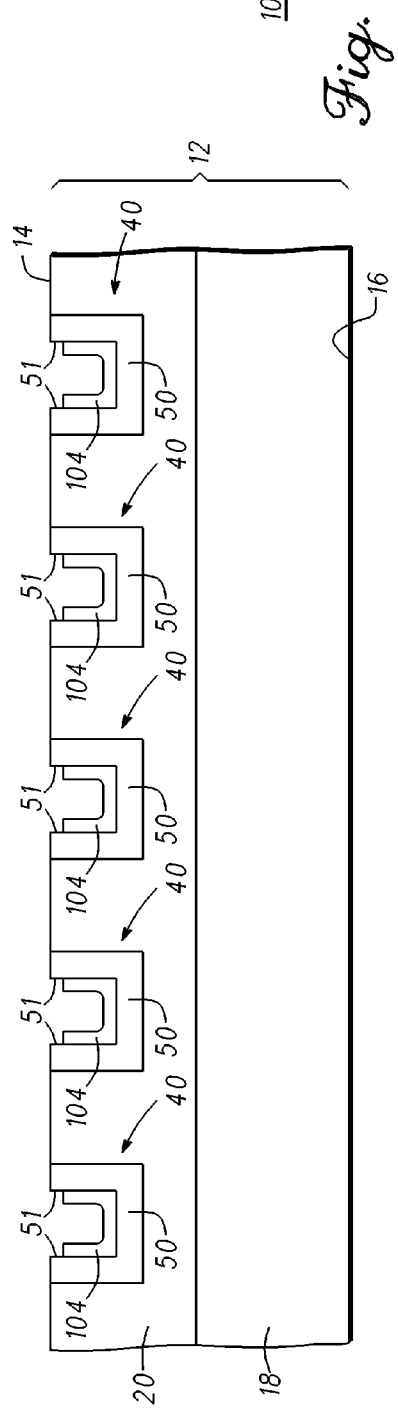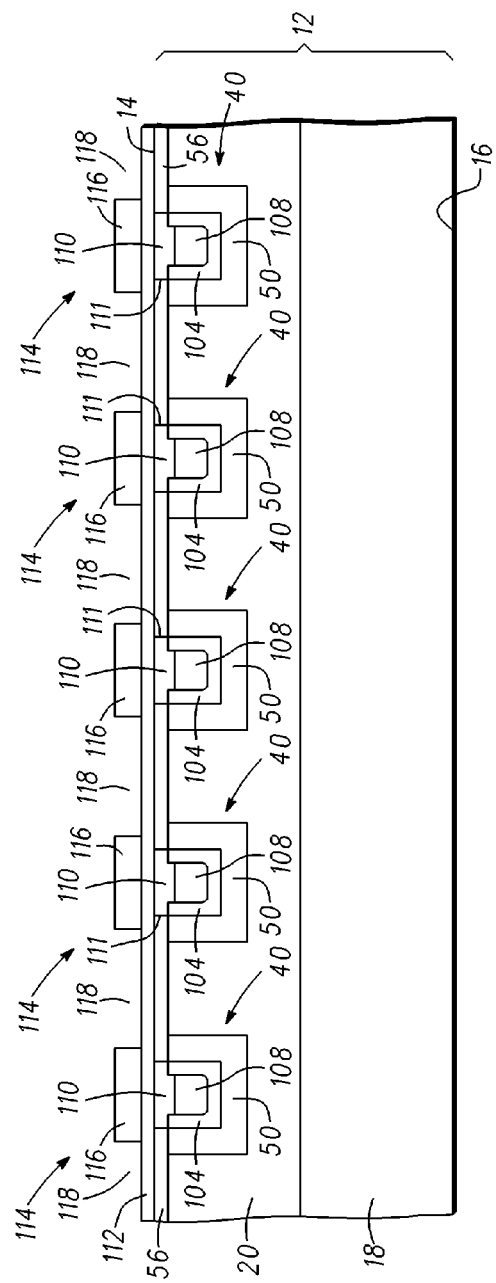

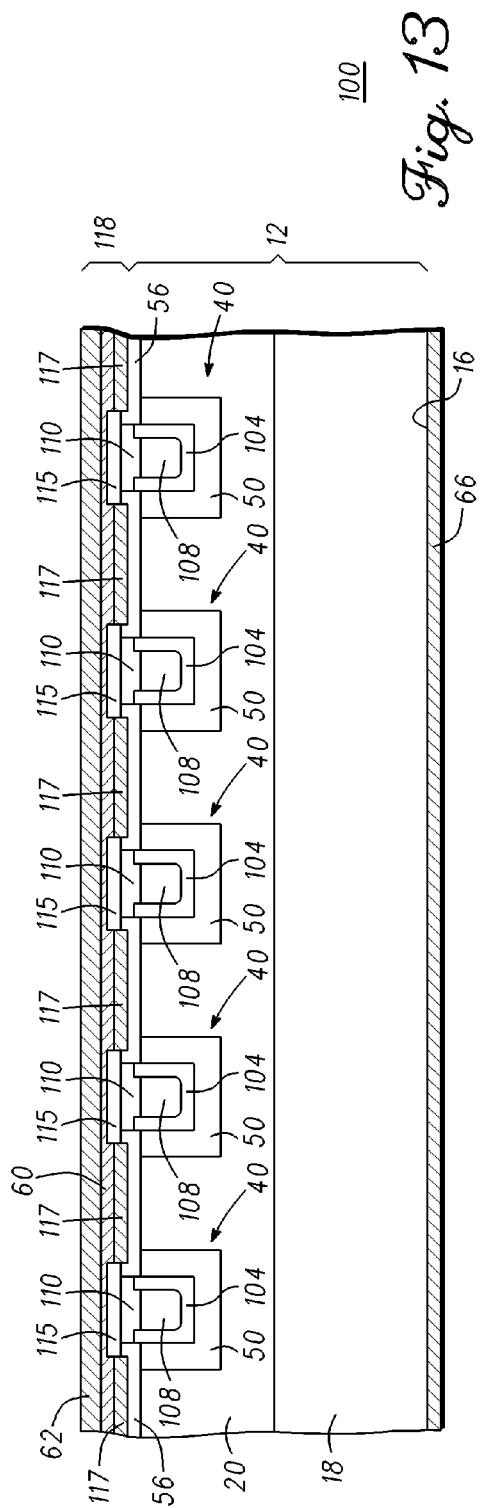
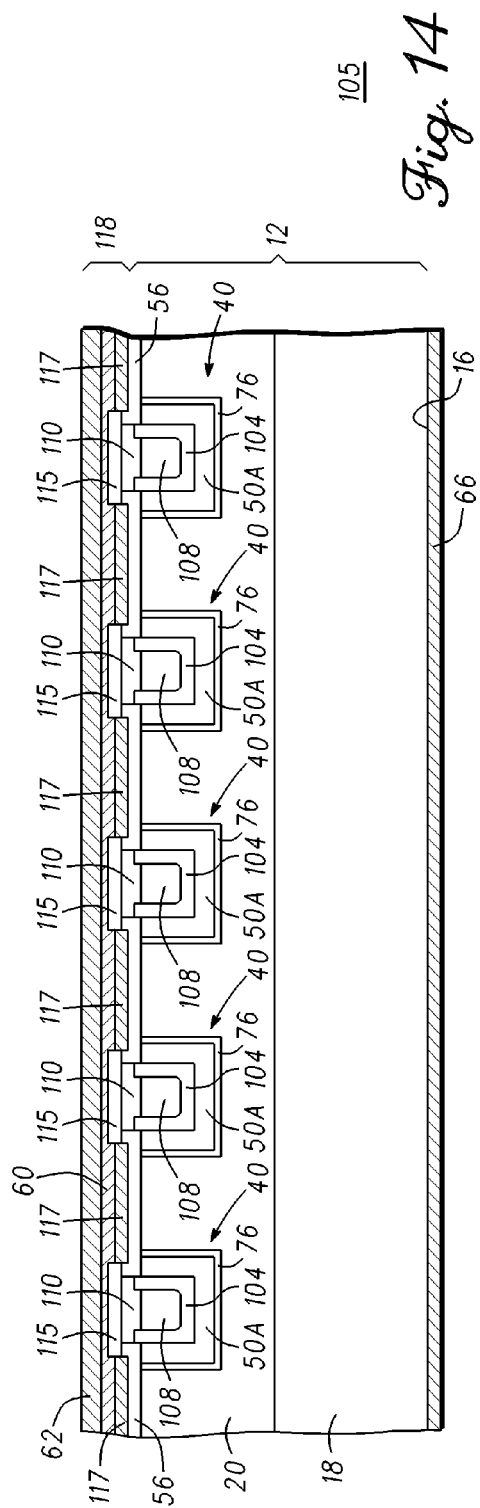

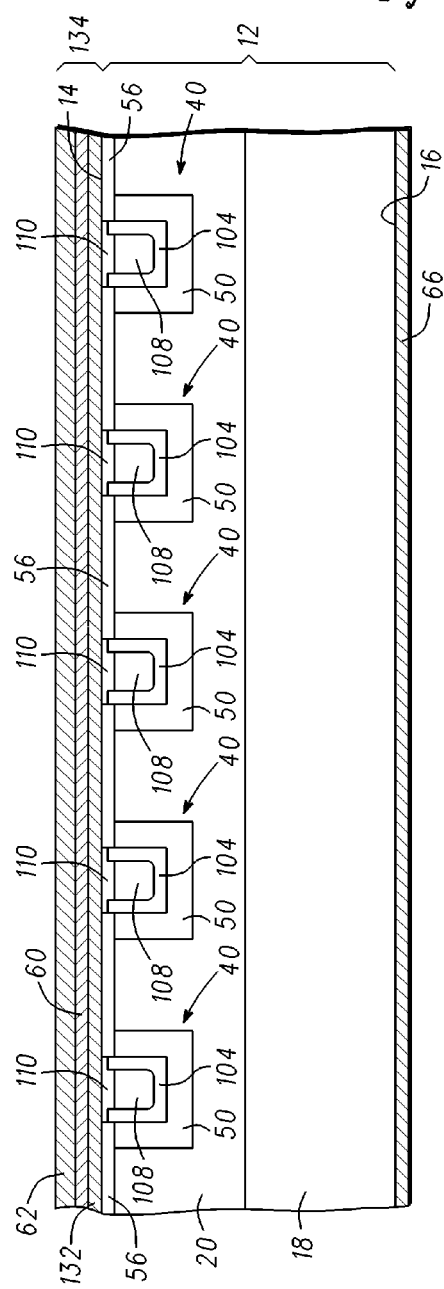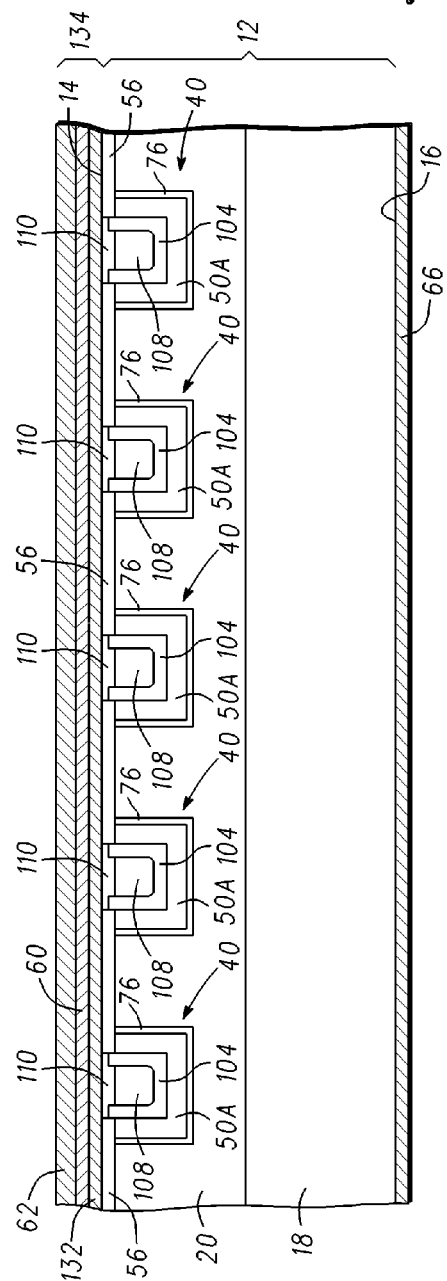

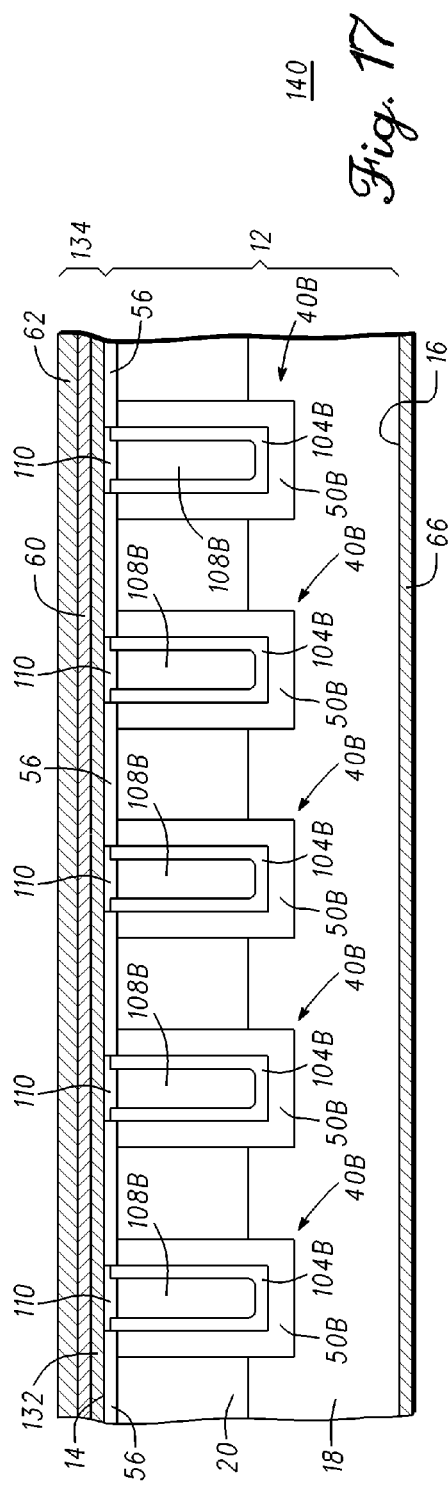
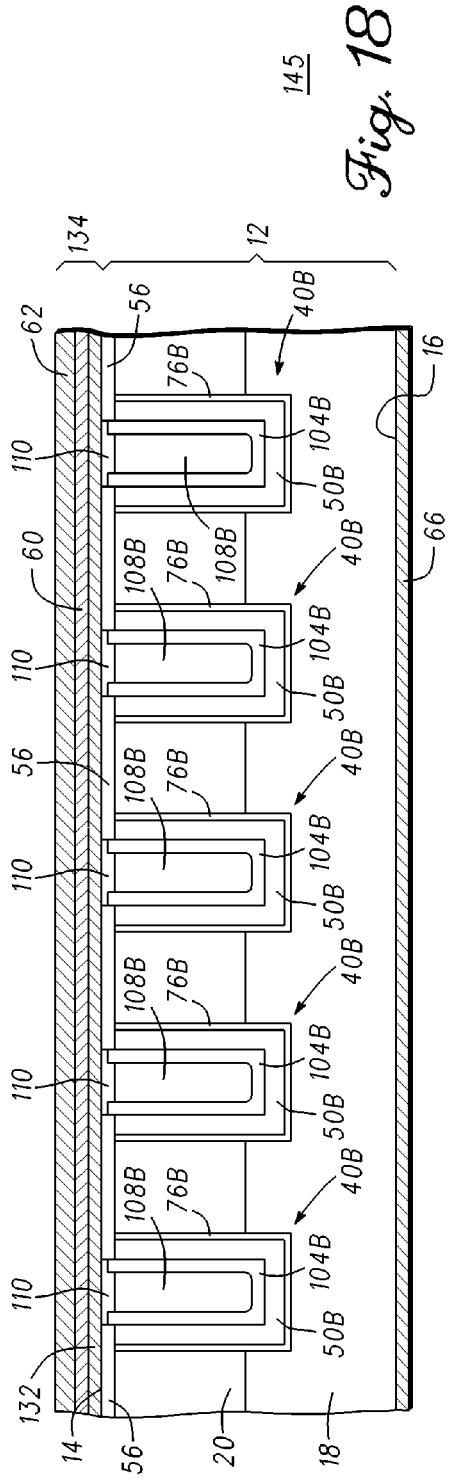

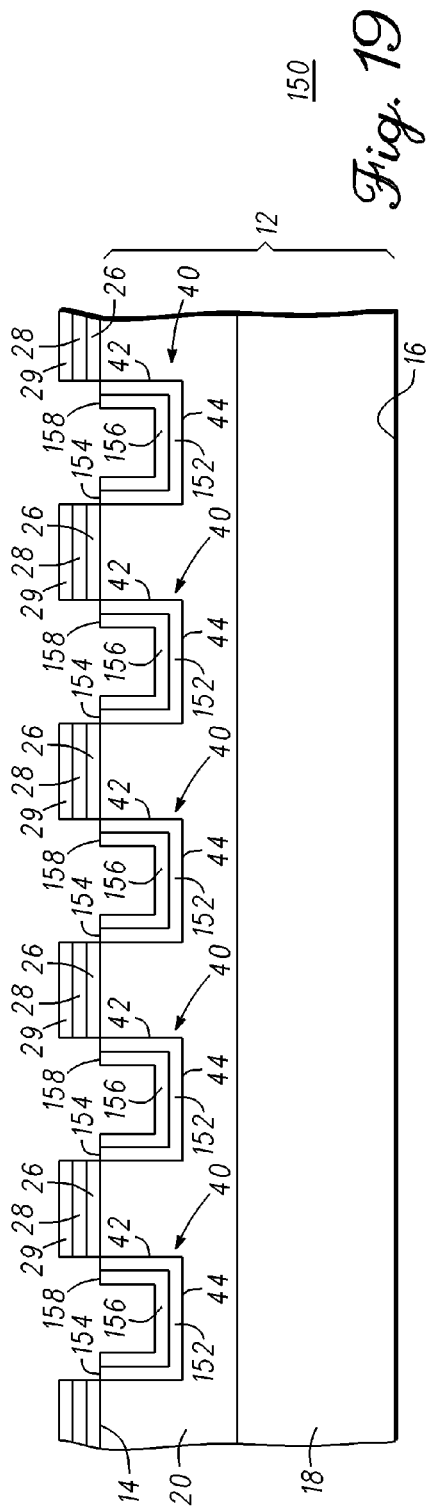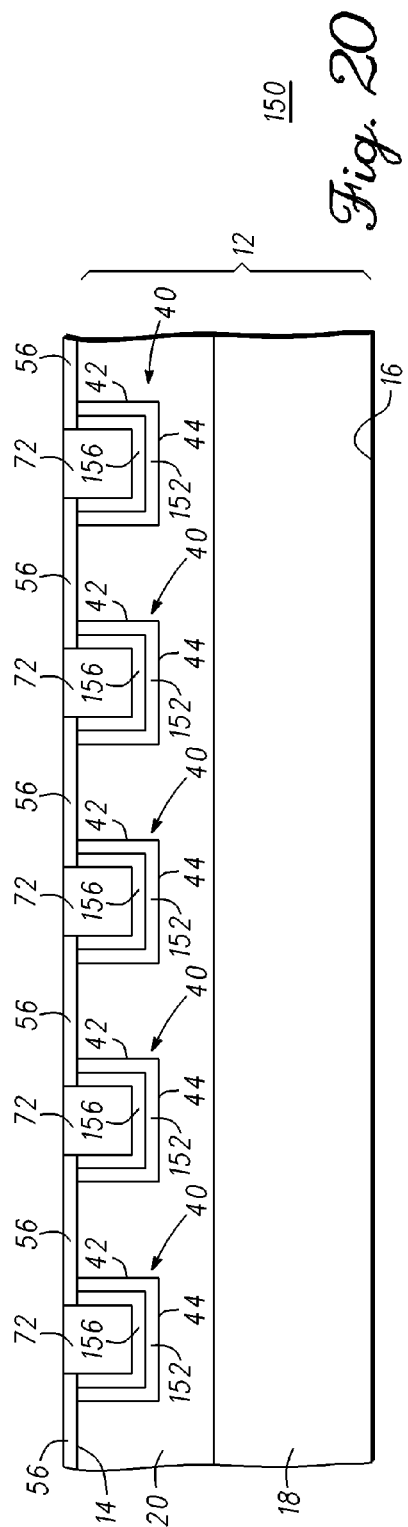

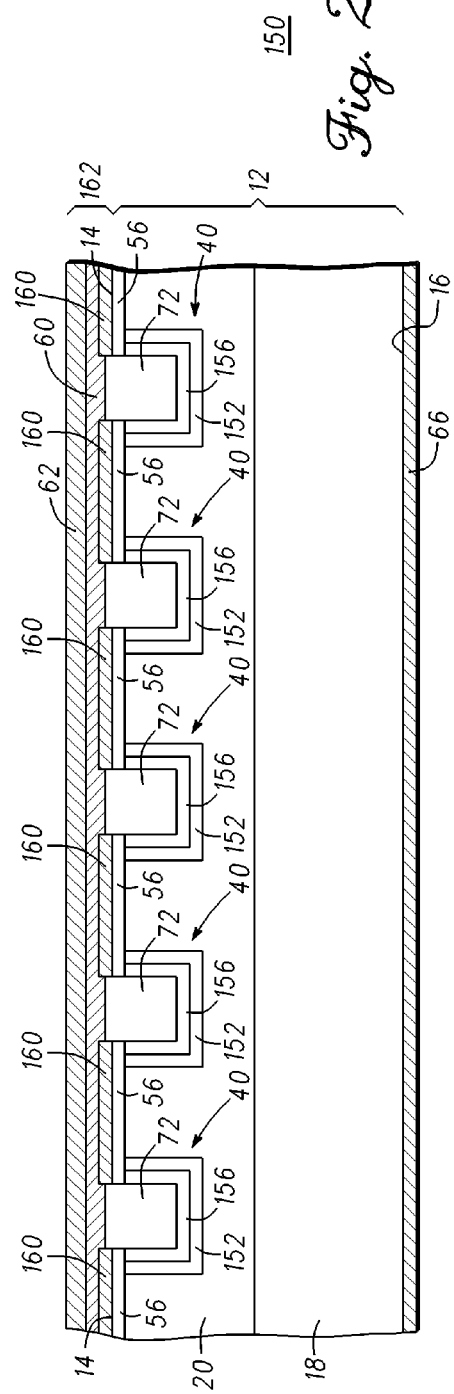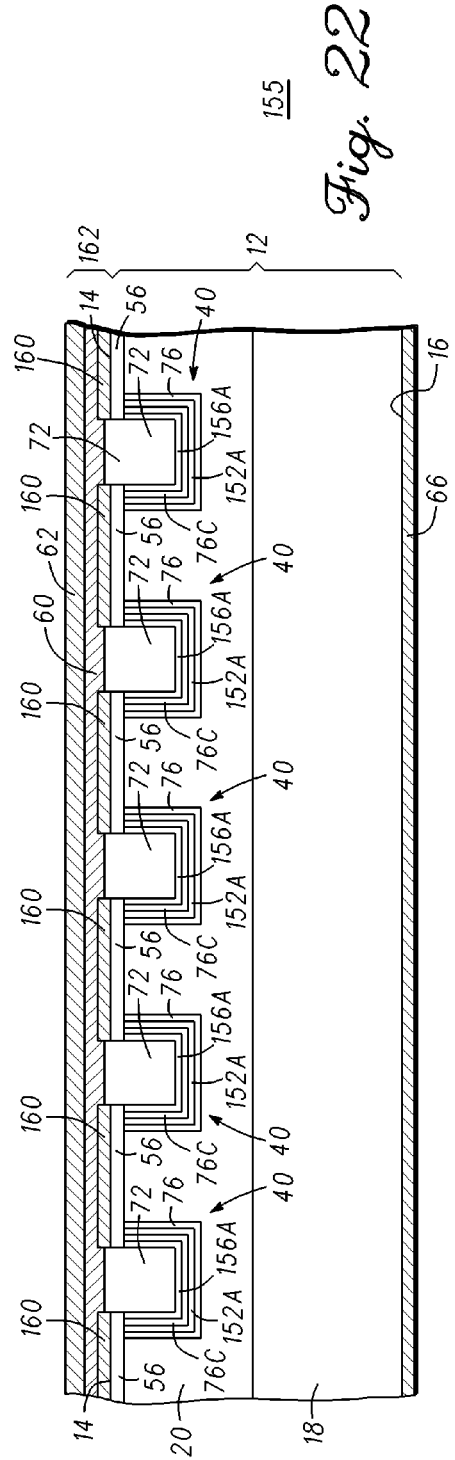

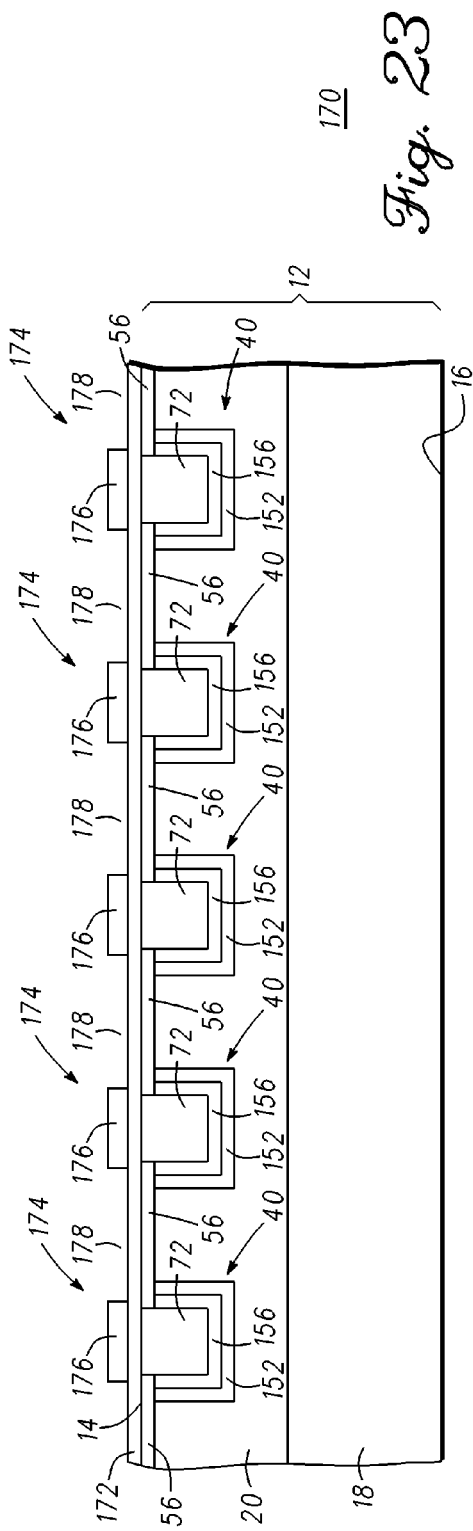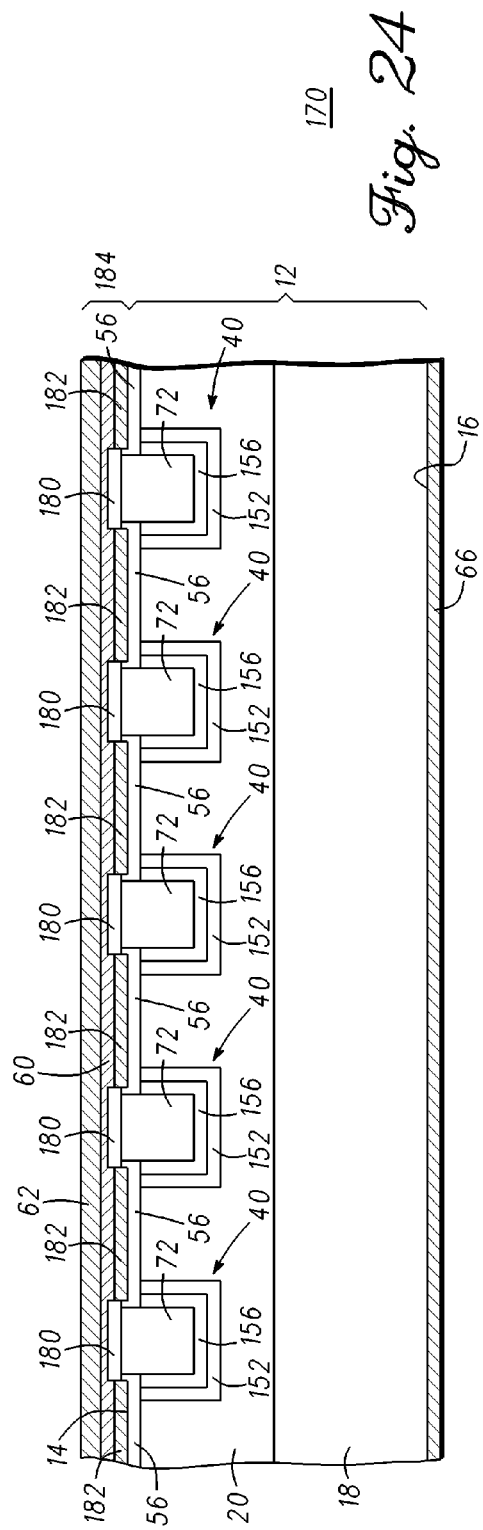

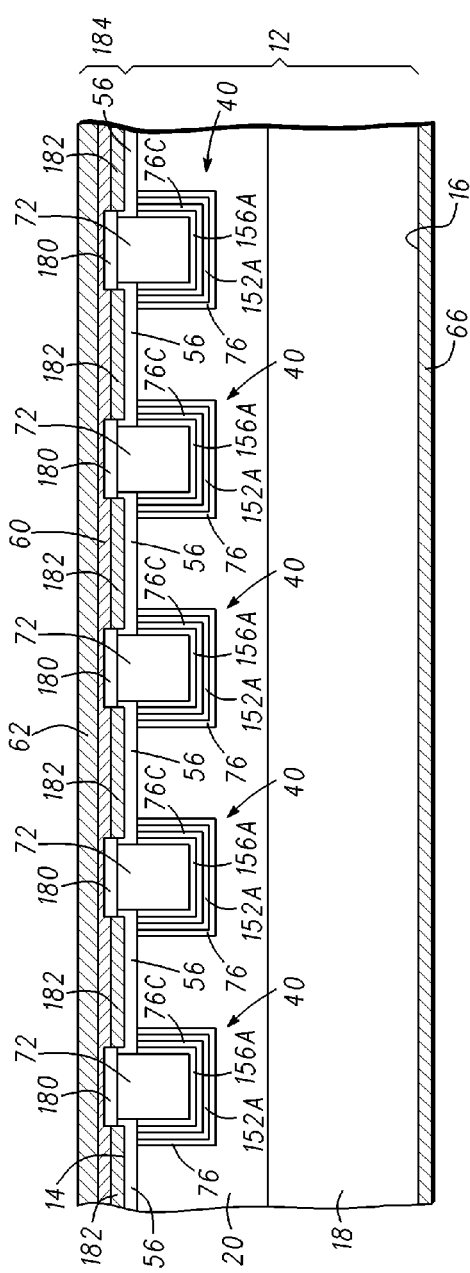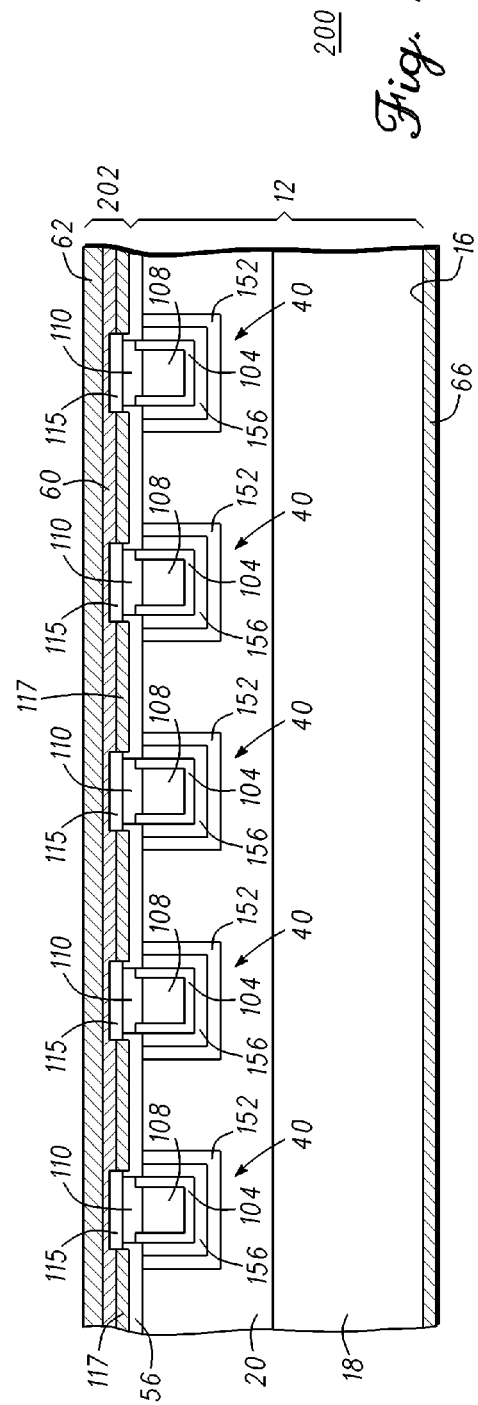

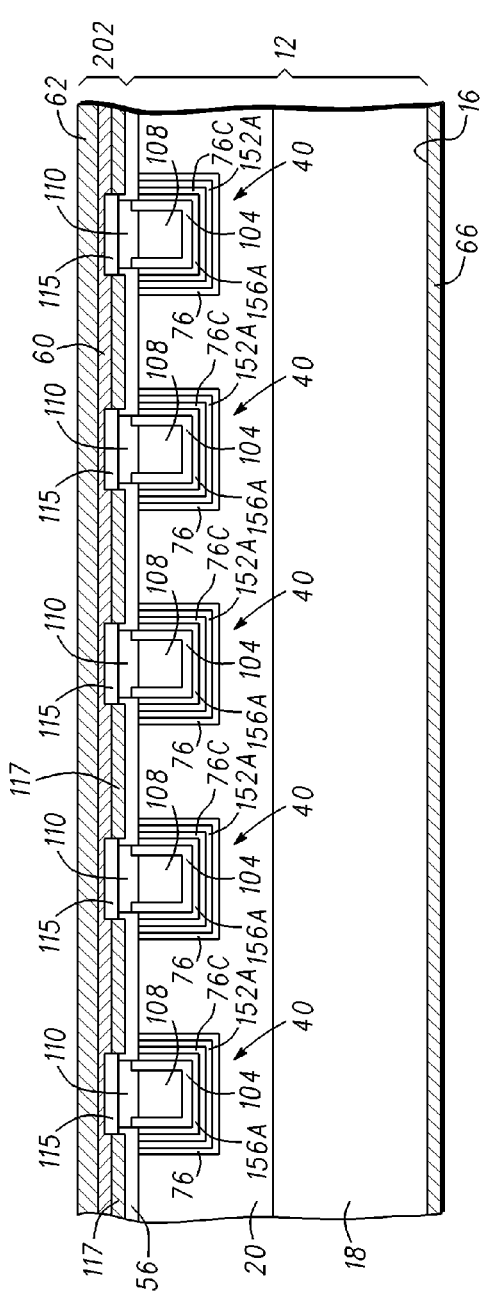
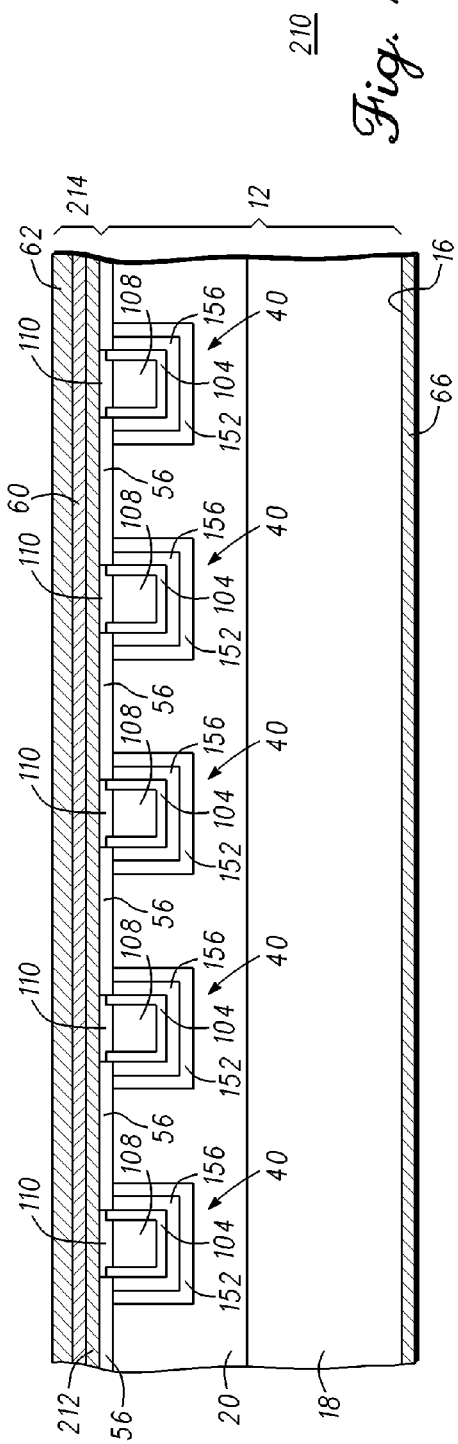

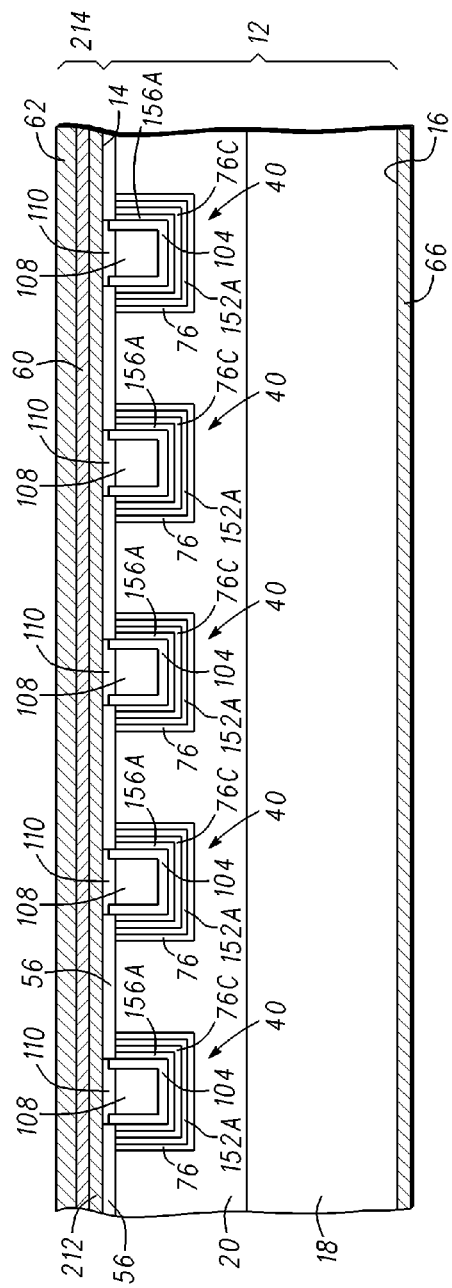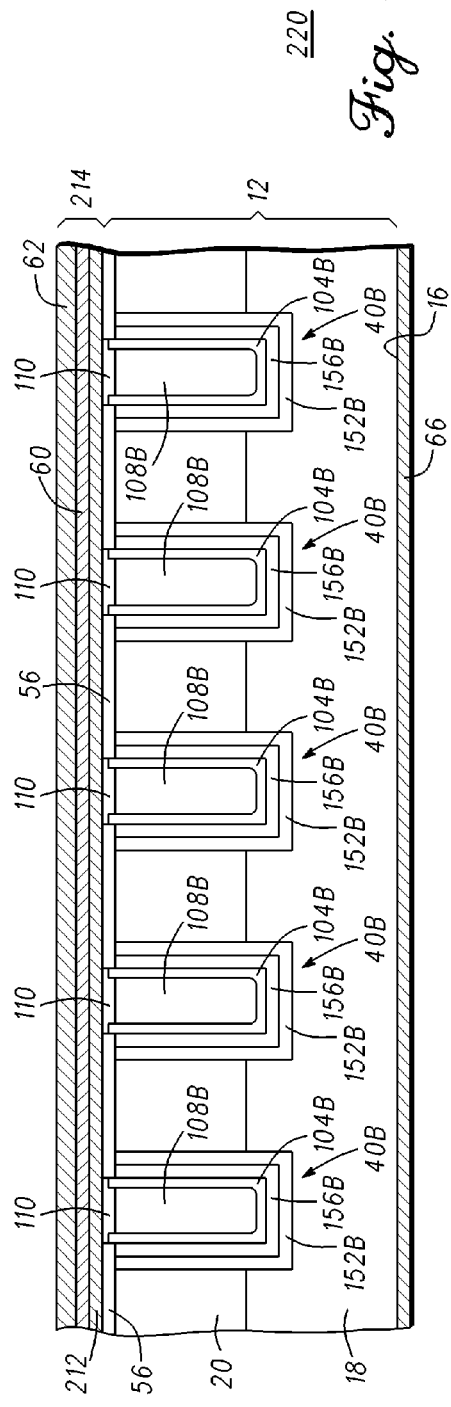

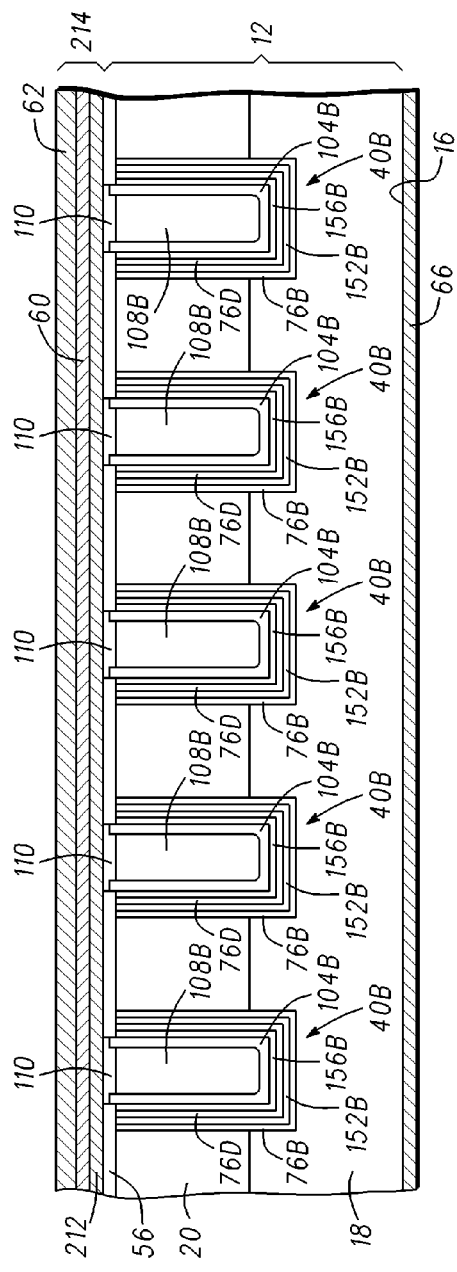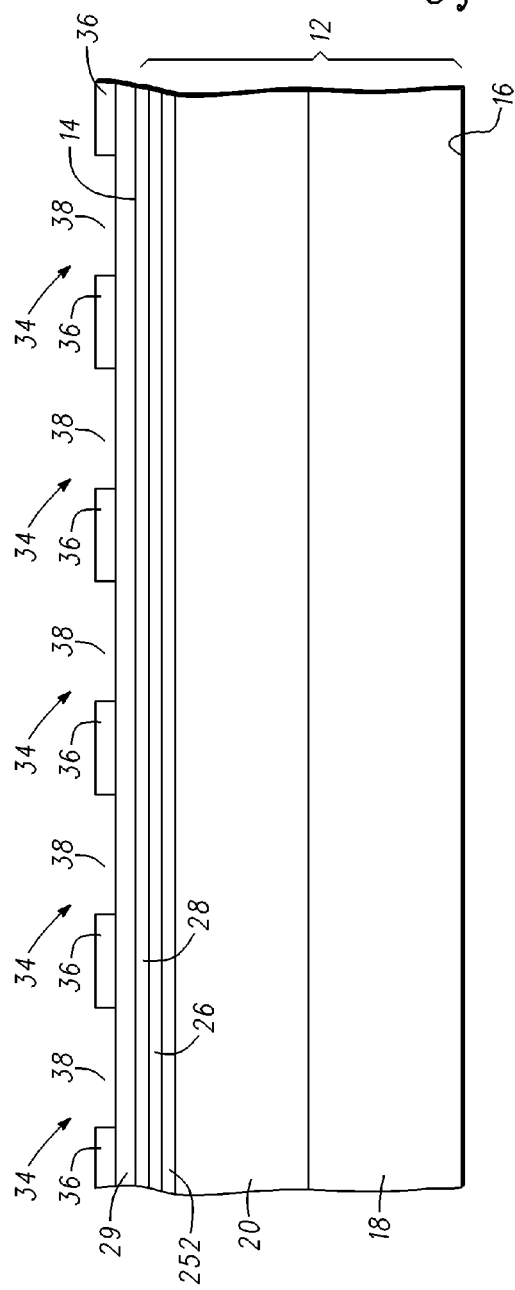

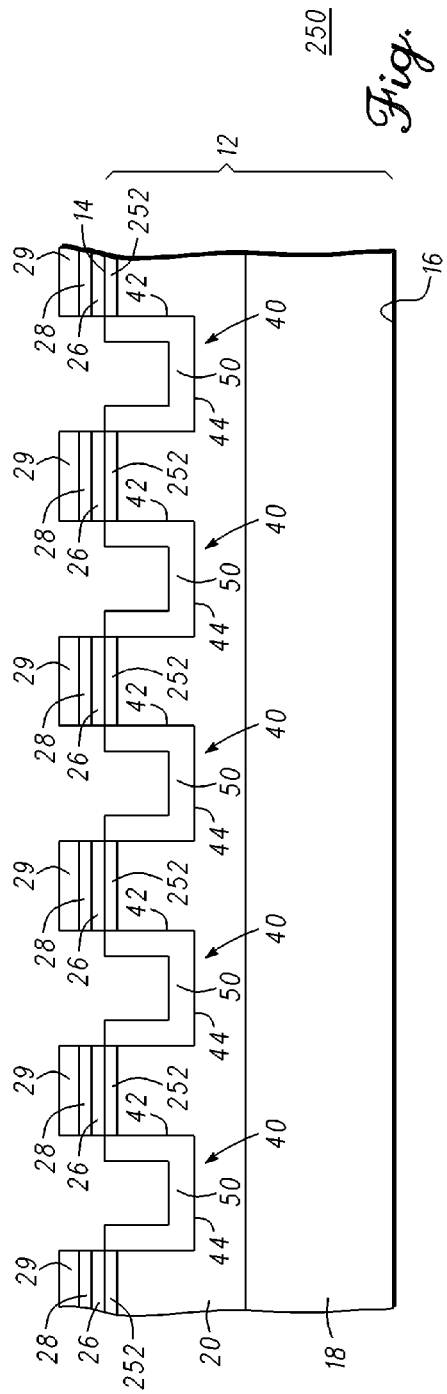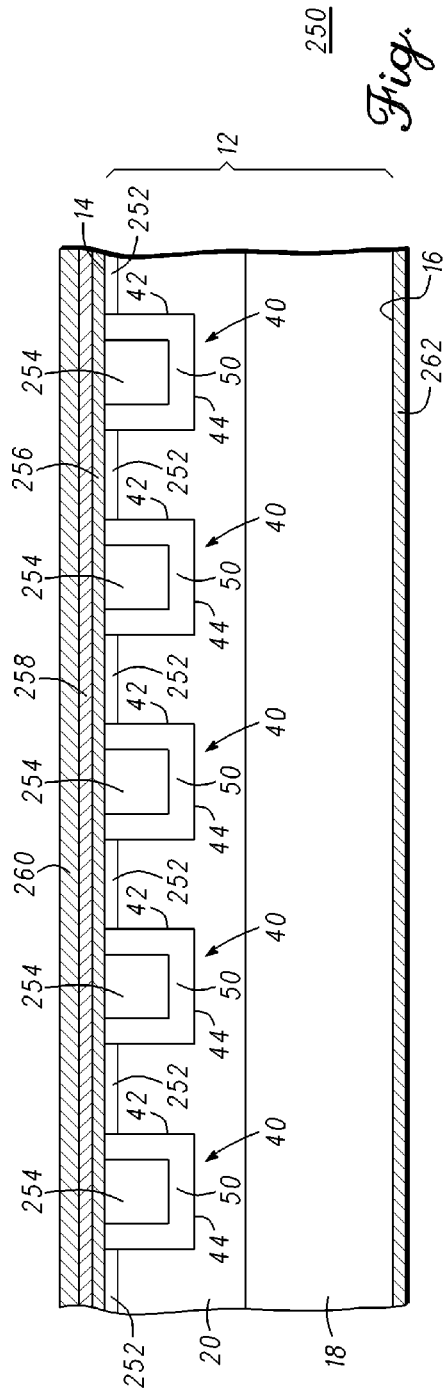

SEMICONDUCTOR COMPONENT AND METHOD OF MANUFACTURE

TECHNICAL FIELD

The present invention relates, in general, to semiconductor components and, more particularly, to charge balance in semiconductor components.

BACKGROUND

Semiconductor components such as a Schottky diode and a Junction Field Effect Transistor (JFET) are well suited for use in high frequency applications because they have short reverse recovery times and low forward voltages, i.e., low losses. However, they have breakdown voltages of less than 200 volts which limits their use to low voltage applications. A Schottky diode is typically comprised of a high work function metal in contact with an N-type conductivity epitaxial layer which is grown on a substrate material of N-type conductivity. Techniques for increasing the breakdown voltage have resulted in an increase in the forward voltage and a decrease in the switching speed of the Schottky diode.

Accordingly, it would be advantageous to have a Schottky diode or a JFET capable of withstanding a large reverse bias voltage while maintaining a low forward voltage drop and fast switching characteristics. It would be of further advantage for the method of manufacturing the Schottky diode or the JFET to be efficient, time efficient, and compatible with Schottky diode or JFET manufacturing processes.

BRIEF DESCRIPTION OF THE DRAWINGS

The present invention will be better understood from a reading of the following detailed description, taken in conjunction with the accompanying drawing figures, in which like reference characters designate like elements and in which:

FIG. 1 is a cross-sectional view of a semiconductor component at an early stage of manufacture in accordance with an embodiment of the present invention;

FIG. 2 is a cross-sectional view of the semiconductor component of FIG. 1 at a later stage of manufacture;

FIG. 3 is a cross-sectional view of the semiconductor component of FIG. 2 at a later stage of manufacture;

FIG. 4 is a cross-sectional view of the semiconductor component of FIG. 3 at a later stage of manufacture;

FIG. 5 is a cross-sectional view of a semiconductor component during manufacture in accordance with another embodiment of the present invention;

FIG. 6 is a cross-sectional view of a semiconductor component during manufacture in accordance with yet another embodiment of the present invention;

FIG. 7 is a cross-sectional view of a semiconductor structure during manufacture in accordance with another embodiment of the present invention;

FIG. 8 is a cross-sectional view of the semiconductor component of FIG. 7 at a later stage of manufacture;

FIG. 9 is a cross-sectional view of a semiconductor component during manufacture in accordance with another embodiment of the present invention;

FIG. 10 is a cross-sectional view of a semiconductor during manufacture in accordance with another embodiment of the present invention;

FIG. 11 is a cross-sectional view of the semiconductor structure of FIG. 10 at a later stage of manufacture;

FIG. 12 is a cross-sectional view of the semiconductor component of FIG. 11 at a later stage of manufacture;

FIG. 13 is a cross-sectional view of the semiconductor component of FIG. 12 at a later stage of manufacture;

FIG. 14 is a cross-sectional view of a semiconductor component during manufacture in accordance with another embodiment of the present invention;

FIG. 15 is a cross-sectional view of a semiconductor component during manufacture in accordance with another embodiment of the present invention;

FIG. 16 is a cross-sectional view of a semiconductor component during manufacture in accordance with another embodiment of the present invention;

FIG. 17 is a cross-sectional view of a semiconductor component during manufacture in accordance with another embodiment of the present invention;

FIG. 18 is a cross-sectional view of a semiconductor component during manufacture in accordance with another embodiment of the present invention;

FIG. 19 is a cross-sectional view of a semiconductor component during manufacture in accordance with another embodiment of the present invention;

FIG. 20 is a cross-sectional view of the semiconductor component of FIG. 19 at a later stage of manufacture;

FIG. 21 is a cross-sectional view of the semiconductor component of FIG. 20 at a later stage of manufacture;

FIG. 22 is a cross-sectional view of a semiconductor component during manufacture in accordance with another embodiment of the present invention;

FIG. 23 is a cross-sectional view of a semiconductor component during manufacture in accordance with another embodiment of the present invention;

FIG. 24 is a cross-sectional view of the semiconductor component of FIG. 23 at a later stage of manufacture;

FIG. 25 is a cross-sectional view of a semiconductor component during manufacture in accordance with another embodiment of the present invention;

FIG. 26 is a cross-sectional view of a semiconductor component during manufacture in accordance with another embodiment of the present invention;

FIG. 27 is a cross-sectional view of a semiconductor component during manufacture in accordance with another embodiment of the present invention;

FIG. 28 is a cross-sectional view of a semiconductor component during manufacture in accordance with another embodiment of the present invention;

FIG. 29 is a cross-sectional view of a semiconductor component during manufacture in accordance with another embodiment of the present invention;

FIG. 30 is a cross-sectional view of a semiconductor component during manufacture in accordance with another embodiment of the present invention;

FIG. 31 is a cross-sectional view of a semiconductor component during manufacture in accordance with another embodiment of the present invention;

FIG. 32 is a cross-sectional view of a semiconductor component at an early stage of manufacture in accordance with another embodiment of the present invention;

FIG. 33 is a cross-sectional view of the semiconductor component of FIG. 32 at a later stage of manufacture; and FIG. 34 is a cross-sectional view of the semiconductor component of FIG. 33 at a later stage of manufacture.

DETAILED DESCRIPTION

Generally the present invention provides a semiconductor component and a method for manufacturing the semiconductor component that includes vertical and horizontal charge balancing. In accordance with embodiments of the present invention, a Schottky diode is fabricated from a semiconductor material comprising an epitaxial layer formed over a semiconductor substrate where the conductivity types of the semiconductor substrate and the epitaxial layer are the same. A plurality of trenches that are laterally spaced apart from each other are formed in the semiconductor material. More particularly, the plurality of trenches extend from a major surface of the semiconductor material into at least the epitaxial layer. In embodiments in which the conductivity type of the semiconductor substrate and the epitaxial layer are N-type, selectively grown epitaxial layers having P-type conductivity are formed on the sidewalls and the floors of the trenches. The concentrations and thicknesses of the selectively grown epitaxial layers having P-type conductivity that are formed on the sidewalls of the trenches and the lateral distances between trenches are selected to provide charge balancing between the selectively grown epitaxial layers and the epitaxial layer. This type of charge balancing is referred to as horizontal charge balancing. The structures that provide charge balancing are referred to as charge balancing structures. The concentrations of the selectively grown epitaxial layers having P-type conductivity at the bottoms of the trenches and the distance between the bottoms of the trenches and the interface between the epitaxial layer and the semiconductor substrate (the substrate-epitaxial layer interface) are selected to provide charge balancing between the selectively grown epitaxial layers at the bottoms of the trenches and the portions of the epitaxial layer between the bottoms of the trenches and the substrate-epitaxial layer interface. This type of charge balancing is referred to as vertical charge balancing. Structures that provide charge balancing are referred to as charge balancing structures. Creating the superjunction effect at the sides or sidewalls and at the bottoms of the trenches increases the breakdown voltages of the Schottky diodes to be greater than 700 volts and lowers their on resistances. Alternatively, this superjunction effect can be achieved when the substrate and epitaxial layer have P-type conductivity and the selectively grown epitaxial layers have N-type conductivity.

A figure of merit, metric, or measure of charge indicates the charge in a semiconductor region and is the product of the dopant concentration and the width of a uniformly doped semiconductor region. This metric is also referred to as a charge figure of merit or a charge metric. For example, the charge in the portion of the epitaxial layer between two adjacent trenches is the product of the concentration and the width of the uniformly doped epitaxial layer. For horizontal charge balancing the charge contributed by the portion of the epitaxial layer between two adjacent trenches is balanced by the charge contributed by the selectively grown epitaxial layers that are on the nearest sidewalls of adjacent trenches. Thus the charge figure of merit for this portion of the epitaxial layer is the uniform dopant concentration of the epitaxial layer times the width of the epitaxial layer. The charge figure of merit for the selectively grown epitaxial layers on the sidewalls of the trenches is the product of the uniform dopant concentration of the selectively grown epitaxial layers and the widths of the selectively grown epitaxial layers. However, each selectively grown epitaxial layer contributes to the charge, thus the charge figure of merit for each selectively grown epitaxial layer on the sidewalls of the trenches is one-half the charge figure of merit for the epitaxial layer. For example, if the lateral distance between adjacent trenches in the epitaxial layer is 4 µm and the dopant concentration in the epitaxial layer is $1 \times 10^{16}$ atoms/cm$^3$, the charge figure of merit for this region of the epitaxial layer is $4 \times 10^{12}$ atoms/cm$^2$. To achieve charge balance, the selectively grown epitaxial layers on the sidewalls from adjacent trenches that face each other contribute to the charge. Because there are two selectively grown epitaxial layers, each selectively grown epitaxial layer contributes to the charge for charge balancing. For uniformly doped selectively grown epitaxial layers, each selectively grown epitaxial layer contributes about one-half of the charge. Thus, each selectively grown epitaxial layer contributes a charge figure of merit of $2 \times 10^{12}$ atoms/cm$^2$. For a dopant concentration of $1 \times 10^{16}$ atoms/cm$^3$, charge balance is achieved by selecting the width of each selectively grown epitaxial layer to be 2 µm.

Vertical charge balancing and the vertical charge figure of merit are similar to the horizontal charge balancing and the horizontal charge figure of merit except that charge balancing occurs between the epitaxial layer below the trenches and the selectively grown epitaxial material on the floors of the trenches. Here a single selectively grown epitaxial layer balances the charge with the epitaxial layer. For example, if the thickness of the selectively grown epitaxial layer is 2 µm and the dopant concentration of the selectively grown epitaxial layer is $1 \times 10^{16}$ atoms/cm$^3$, the charge figure of merit for the selectively grown semiconductor material is $2 \times 10^{12}$ atoms/cm$^2$. For vertical charge balancing, the charge figure of merit is $2 \times 10^{12}$ atoms/cm$^2$, if the dopant concentration of the epitaxial layer is $1 \times 10^{16}$ atoms/cm$^3$, the vertical distance between the trench floors and the substrate-epitaxial layer interface is 2 µm.

In accordance with alternative embodiments, a Junction Field Effect Transistor is manufactured from the semiconductor material, wherein the JFET includes charge balancing structures like the charge balancing structures described above.

Figures 1, 2:
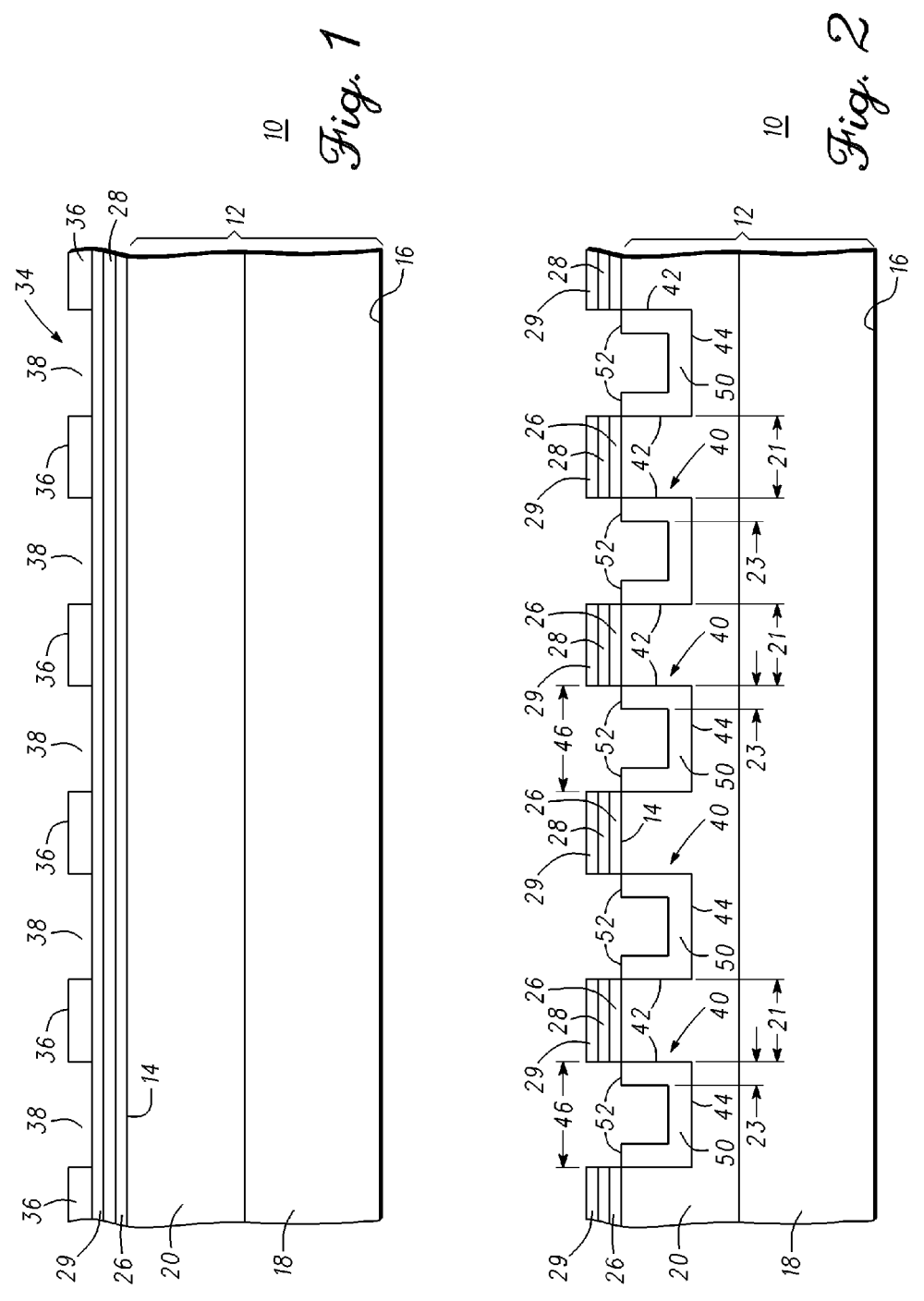

FIG. 1 is a cross-sectional view of a portion of a semiconductor component 10 such as for example, a Schottky diode, during manufacture in accordance with an embodiment of the present invention. What is shown in FIG. 1 is a semiconductor material 12 having opposing surfaces 14 and 16. Surface 14 is also referred to as a front or top surface and surface 16 is also referred to as a bottom or back surface. In accordance with this embodiment, semiconductor material 12 comprises an epitaxial layer 20 formed on a semiconductor substrate 18. Preferably, substrate 18 is silicon heavily doped with an N-type dopant or impurity material and epitaxial layer 20 is silicon lightly doped with an N-type dopant. By way of example, substrate 18 has a dopant concentration ranging from about $1 \times 10^{19}$ atoms per centimeter cubed (atoms/cm$^3$) to about $5 \times 10^{19}$ atoms/cm$^3$. The dopant concentration of epitaxial layer 20 will be further discussed below. Substrate layer 18 provides a low resistance conduction path for the current to flow from the anode to the cathode of a Schottky diode. It should be noted that a region or layer doped with an N-type dopant is said to be of an N-type conductivity or an N conductivity type and a region or layer doped with a P-type dopant is said to be of a P-type conductivity or a P conductivity type.

A layer of dielectric material 26 is formed on or from epitaxial layer 20. In accordance with an embodiment of the present invention, the material of dielectric layer 26 is silicon dioxide having a thickness ranging from about 200 Angstroms (Å) to about 1,000 Å. Techniques for forming silicon dioxide layer 26 are known to those skilled in the art. A protective layer 28 is formed on dielectric layer 26. Protective layer 28 is also referred to as a hard mask and may be silicon nitride having a thickness ranging from about 500 Å to about 2,000 Å. By way of example, dielectric layer 26 has a thickness of about 300 Å and protective layer 28 has a thickness of about 1,000 Å. Preferably, the materials of layers 26 and 28 are selected so that protective layer 28 restricts oxygen diffusion and therefore protects underlying layers from oxidation. Although protective layer 28 is shown as a single layer of material, it can also be a multi-layered structure of different material types. A layer of oxide formed by deposition of tetraethylorthosilicate 29, i.e., a TEOS layer, is formed on protective layer 28. By way of example, TEOS layer 29 has a thickness of about 10,000 Å and is deposited using plasma enhanced chemical vapor deposition.

Still referring to FIG. 1, a layer of photoresist is patterned over TEOS layer 29 to form a masking structure 34 having masking elements 36 and openings 38 that expose portions of TEOS layer 29. Masking structure 34 is also referred to as a mask or an etch mask.

Referring now to FIG. 2, trenches 40 having sidewalls 42 and floors 44 are formed in epitaxial layer 20 by removing portions of TEOS layer 29, protective layer 28, dielectric layer 26, and epitaxial layer 20. More particularly, the exposed portions of TEOS layer 29 and the portions of dielectric layers 26 and 28 and epitaxial layer 20 that are below the exposed portions of TEOS layer 29 are removed. Trenches 40 have a width 46 at surface 14. In an exemplary embodiment, Deep Reactive Ion Etching (DRIE) etching with a fluorine or chlorine based chemistry is used to form trenches 40. Several techniques are available for DRIE etching including cryogenic, high density plasma, or Bosch DRIE processing. Preferably, trenches 40 have substantially vertical sidewalls. However, trenches 40 may have a tapered profile where the width of trenches 40 at trench floor 44 is less than width 46. In embodiments in which sidewalls 42 are substantially vertical and floors 44 are substantially parallel to surface 14, sidewalls 42 serve as vertical surfaces and floors 44 serve as horizontal surfaces. Although trenches 40 are stated as plural, it is understood that trenches 40 may be a single continuous trench or connected trench matrix. Alternatively, trenches 40 may be a plurality of individual trenches with closed ends and separated by portions of semiconductor material 12. Trenches 40 are shown as ending in epitaxial layer 20, however, this is not a limitation of the present invention. For example, trenches 40 may end at substrate 18 or they may extend into substrate 18. The etching technique and the number of trenches 40 formed in epitaxial layer 20 are not limitations of the present invention.

A layer of epitaxial material 50 is selectively grown along sidewalls 42 and floors 44 of trenches 40. Selectively grown epitaxial layers 50 have top surfaces 52 that are substantially planar with surface 14. Epitaxial layers 50 are referred to as selectively grown epitaxial layers. Preferably, the thickness and dopant concentrations of epitaxial layer 20 and selectively grown epitaxial layers 50 are selected to preserve charge balance between them. The charge figure of merit for a uniformly doped epitaxial layer is the product of the concentration and the width of the uniformly doped epitaxial layer. The thickness of epitaxial layer 20 is the lateral distance between adjacent trenches 40 and indicated by arrows 21, whereas the thickness of each selectively grown epitaxial layer 50 is the lateral distance between sidewall 42 and a surface of an adjacent selectively grown epitaxial layer 50 and indicated by arrows 23. For example, when the lateral distance between adjacent trenches in epitaxial layer 20 is 2 μm and the dopant concentration in epitaxial layer 20 is $1\times10^{16}$ atoms/cm$^3$, the charge figure of merit for this region of epitaxial layer 20 is $2\times10^{12}$ atoms/cm$^2$. For charge balance, the charge figure of merit for the selectively grown epitaxial layers 50 between adjacent trenches is set to be $2\times10^{12}$ atoms/cm$^2$. However, each selectively grown epitaxial layer 50 contributes to the charge, thus, the charge figure of merit for each selectively grown epitaxial layer 50 is designed to be half the charge figure of merit for the regions of epitaxial layer 20 between adjacent trenches 40. In this example, the charge figure of merit contributed by each selectively grown epitaxial layer 50 is $1\times10^{12}$ atoms/cm$^2$. For a dopant concentration of $1\times10^{16}$ atoms/cm$^3$, charge balance is achieved by selecting the width of each selectively grown epitaxial layer 50 to be 1 μm. It should be noted that the selection of dopant concentration, charge, and dimensions is a design choice wherein they are selected to maintain charge balance. By way of example, selectively grown epitaxial layers are of P-type conductivity and epitaxial layer 20 is of N-type conductivity and their dopant concentrations range from about $1\times10^{16}$ atoms/cm$^3$ to about $5\times10^{16}$ atoms/cm$^3$.

Although it is preferable that layers 50 be selectively grown epitaxial layers, this is not a limitation of the present invention. Alternatively, an epitaxial layer (not shown) may be formed in trenches 40 and over surface 14 and planarized leaving epitaxial layers over sidewalls 42 and over floors 44. An advantage of selectively growing epitaxial layers 50 is that the layers can be thin with a substantially constant doping level or dopant concentration, i.e., a substantially constant dopant profile. In addition, selectively growing the epitaxial layers allows for the formation of thinner layers lining sidewalls 42 and floors 44, which decreases the sizes of the Schottky diodes and the amount of outdiffusion from selectively grown epitaxial layers 50 into epitaxial layer 20, which outdiffusion increases the sizes of the Schottky diode.

Referring now to FIG. 3, dielectric layers 29, 28, and 26 are removed using techniques known to those skilled in the art. A material is formed over epitaxial layer 20 and selectively grown epitaxial layers 50. Preferably, the material overfills trenches 40. In accordance with an embodiment of the present invention, the material is undoped polysilicon. Techniques for forming polysilicon in trenches are known to those skilled in the art. The material is planarized using, for example, chemical mechanical planarization ("CMP"). Planarizing the material leaves portions 54 in trenches 40. Portions 54 are referred to as polysilicon plugs or capacitance modulation structures. It should be noted that polysilicon plugs 54 are undoped to maintain charge balance between selectively grown epitaxial layers 50 and epitaxial layer 20. Portions of epitaxial layer 20, selectively grown epitaxial layers 50, and polysilicon plugs 54 are doped with an impurity material of P-type conductivity such as, for example, boron or indium to form a barrier height adjustment region or barrier height adjustment layer 56 having a thickness ranging from about 500 Å to about 1,000 Å. By way of example, barrier height adjustment layer 56 is formed by implanting the impurity material into epitaxial layer 20, selectively grown epitaxial layers 50, and polysilicon plugs 54 to form barrier height adjustment layer 56 having a charge figure of merit ranging from about $1\times10^{10}$ to about $5\times10^{11}$ atoms/cm$^2$. The implant for forming barrier height adjustment layer 56 is referred to as a barrier height adjustment implant. Selectively grown epitaxial layers 50, epitaxial layer 20, and polysilicon plugs 54 are annealed using a rapid thermal anneal technique. It should be noted that the barrier height adjustment implant can be a dopant implant of either N-type conductivity or P-type conductivity depending on the desired barrier height.

Referring now to FIG. 4, a layer of refractory metal (not shown) is deposited over epitaxial layer 20, selectively grown epitaxial layers 50, and polysilicon plugs 54. By way of example, the refractory metal is titanium having a thickness ranging from about 100 Å to about 1,000 Å. The refractory metal is heated to a temperature ranging from about 350° C.

to about 700° C. The heat treatment causes the titanium to react with the silicon to form titanium silicide in all regions in which the titanium is in contact with silicon or polysilicon. Thus, a titanium silicide layer 58 is formed from the portions of barrier height adjustment layer 56 that are in epitaxial layer 20, selectively grown epitaxial layers 50, and undoped polysilicon plugs 54.

A barrier metal layer 60 is formed in contact with titanium silicide layer 58. Suitable materials for barrier metal layer 60 include titanium nitride, titanium, tungsten, platinum, or the like. A metal layer 62 is formed in contact with barrier metal layer 60. Suitable materials for metal layer 62 include aluminum, nickel, silver, or the like. Silicide layer 58, barrier metal layer 60, and metal layer 62 form an anode or anode contact 64 of Schottky diode 10 and also may be referred to as a metallization system. A conductor 66 is formed in contact with surface 16 and serves as a cathode or cathode contact for Schottky diode 10 and may be referred to as a metallization system. Suitable metallization systems for conductor 66 include a gold alloy, titanium-nickel-gold, titanium-nickel-silver, or the like.

FIG. 5 is a cross-sectional view of a semiconductor component 70 such as, for example, a Schottky diode in accordance with another embodiment of the present invention. Semiconductor component 70 is similar to semiconductor component 10 except that oxide plugs 72 in trenches 40 are formed instead of or in place of polysilicon plugs 54. Because the refractory metal fails to react with the oxide material of oxide plugs 72, silicide is not formed from oxide plugs 72. Thus, silicide layers 74 are formed from epitaxial layer 20 and from selectively grown epitaxial layers 50, but not from the oxide material of oxide plugs 72. For the sake of clarity barrier height adjustment layer 56 is not shown as being formed in oxide plugs 72. However, it should be understood that barrier height adjustment layer 56 is also formed in oxide plugs 72. A barrier metal layer 60 is formed in contact with silicide layers 74 and oxide plugs 72 and a metal layer 62 is formed in contact with barrier metal layer 60. Silicide layers 74, barrier metal layer 60, and metal layer 62 form an anode or anode contact 64. A conductor 66 is formed in contact with surface 16 and serves as a cathode or cathode contact for Schottky diode 70. Suitable metallization systems for conductor 66, barrier metal layer 60, and metal layer 62 have been described above.

Thus, the portions of epitaxial layer 20 between adjacent trenches 40 and the portions of selectively grown epitaxial layers 50 on sidewalls 42 cooperate to form horizontal or lateral charge balancing structures 78 in Schottky diodes 10 and 70. The portions of epitaxial layer 20 between floors 44 and semiconductor substrate 18 and the portion of selectively grown epitaxial layers 50 on floors 44 cooperate to form vertical charge balancing structures 79 in Schottky diodes 10 and 70. The horizontal and vertical charge balancing structures produce a superjunction effect in Schottky diodes 10 and 70 that increases their breakdown voltages, reduces their on resistances, lowers their forward voltage drops, and provides fast switching with soft recovery while retaining the breakdown voltage by controlling minority carrier injection in epitaxial layer 20. For example, the breakdown voltage of Schottky diodes 10 and 70 can range to more than 700 volts.

FIG. 6 is a cross-sectional view of a semiconductor component 75 such as for example, a Schottky diode, in accordance with another embodiment of the present invention. It should be noted that the processing steps described with reference to FIG. 1 and a portion of FIG. 2 for manufacturing Schottky diode 10 may be the same as those for manufacturing Schottky diode 75. The description of FIG. 6 continues from the description of FIG. 2 after formation of trenches 40. A layer of selectively grown intrinsic or undoped silicon 76 having, for example, a thickness ranging from about 1,000 Å to about 2,000 Å is formed on sidewalls 42 and floors 44 of trenches 40. A layer of epitaxial material 50A is selectively grown along undoped silicon layers 76. Epitaxial layers 50A are referred to as selectively grown epitaxial layers. Selectively grown epitaxial layers 50A are similar to selectively grown epitaxial layers 50 except that they are formed on undoped silicon layers 76 rather than on sidewalls 42 and floors 44 of trenches 40. Thus the description for the formation and dopant concentrations of selectively grown epitaxial layers 50 applies to the formation of selectively grown epitaxial layers 50A. Intrinsic silicon layers 76 serve as a buffer between regions of different conductivity type to inhibit or reduce these regions from compensating each other. More particularly, intrinsic silicon layers 76 serve as a buffer between epitaxial layer 20 which have N-type conductivity and selectively grown epitaxial layers 50A which have P-type conductivity. In the absence of intrinsic silicon layers 76, the dopant or impurity materials from N-type epitaxial layer 20 and the impurity material from P-type selectively grown epitaxial layers 50A will merge and compensate each other. There will still be charge balance in these regions, but the charge will be reduced. For example, if the target charge figure of merit is $1 \times 10^{12}$ atoms/cm$^2$, merging of the impurity materials may cause the charge figure of merit to be reduced to $0.7 \times 10^{12}$ atoms/cm$^2$. Merging of the impurity materials increases the on resistances of the Schottky diodes.

Still referring to FIG. 6 and like Schottky diode 10, undoped polysilicon plugs 54 are formed on epitaxial layers 50A and a barrier height adjustment layer 56 is formed in epitaxial layer 20, selectively grown epitaxial layer 50A, undoped polysilicon plugs 54, and in intrinsic silicon layer 76. A silicide layer 58 is formed from epitaxial layer 20, selectively grown epitaxial layers 50, undoped polysilicon plugs 54, and intrinsic or undoped silicon layers 76. A barrier metal layer 60 is formed in contact with titanium silicide layer 58, a metal layer 62 is formed in contact with barrier metal layer 60, and a conductor 66 is formed in contact with surface 16. Silicide layer 58, barrier metal layer 60, metal layer 62, and conductor 66 have been described above.

Schottky diode 75 has a superjunction comprising epitaxial layer 20 and selectively grown epitaxial layers 50A in which the charge in these regions is balanced as between each other. Balancing the charge in these regions provides a low resistance current path for current flow from the anode to the cathode, which lowers the forward voltage drop of Schottky diode 75. Schottky diode 75 further includes compensation inhibition layers 76 that inhibit charge compensation due to the outdiffusion of dopants from selectively grown epitaxial layers 50A. As discussed above, charge balance is maintained in the presence of compensation, however the compensation decreases the overall charge figure of merit.

Figures 7, 8:
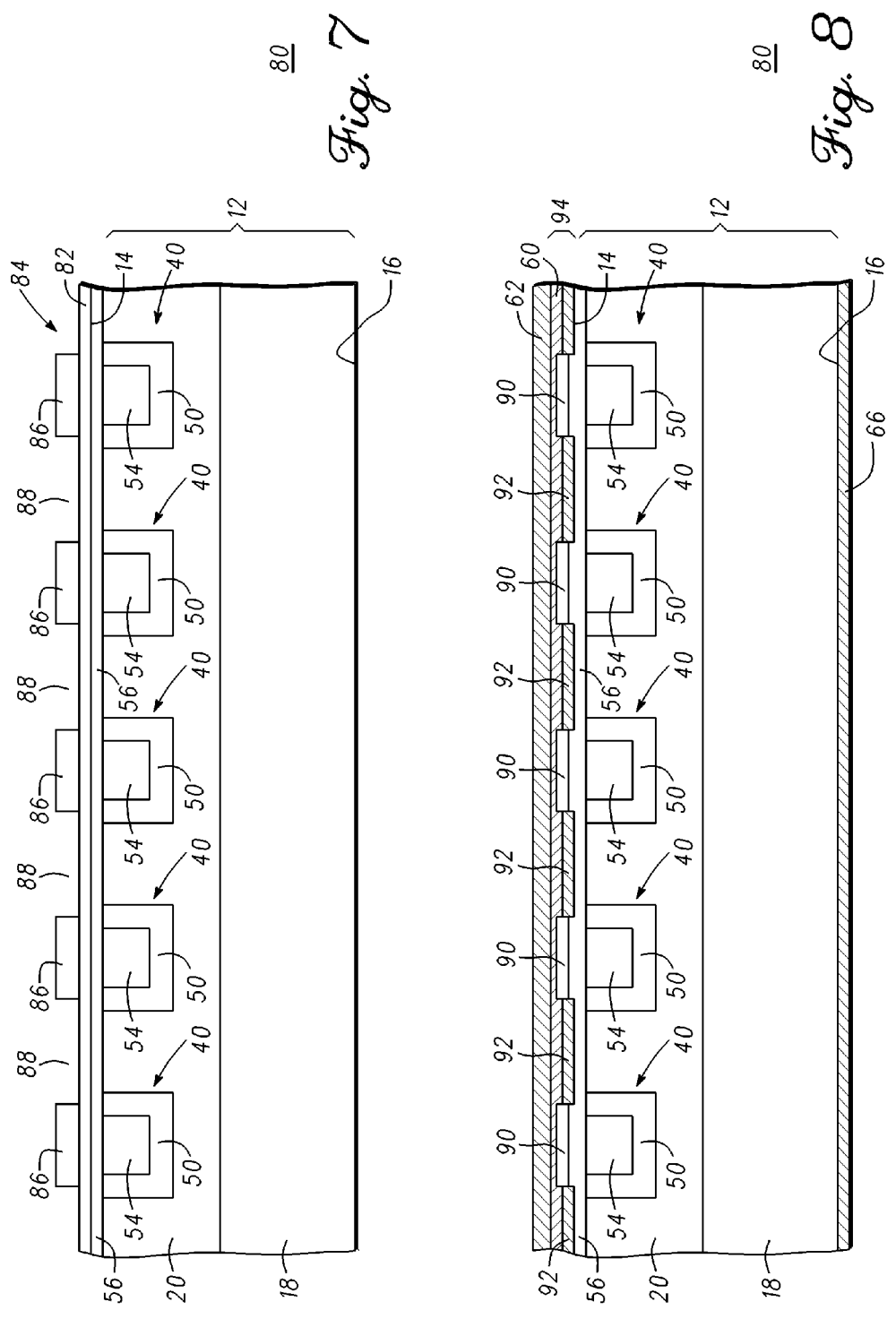

FIG. 7 is a cross-sectional view of a semiconductor component 80 such as, for example, a Schottky diode, in accordance with another embodiment of the present invention. It should be noted that the processing steps described with reference to FIGS. 1-3 for manufacturing semiconductor component 10 may be the same as those for manufacturing semiconductor component 80. Thus, the description of FIG. 7 continues from the description of FIG. 3. What is shown in FIG. 7 is semiconductor material 12 having trenches 40 extending into epitaxial layer 20, selectively grown epitaxial layers 50, polysilicon plugs 54, and a barrier height adjustment layer 56. A layer of dielectric material 82 having a thickness ranging from about 0.5 μm to about 1.5 μm is formed on barrier height adjustment layer 56. It should be noted that barrier height adjustment layer 56 is formed in portions of epitaxial layer 20, selectively grown epitaxial layers 50, and polysilicon plugs 54, thus, dielectric layer 82 is formed on epitaxial layer 20, selectively grown epitaxial layers 50, and polysilicon plugs 54. By way of example, dielectric layer 82 is a TEOS layer. A layer of photoresist is patterned over dielectric layer 82 to form a masking structure 84 having masking elements 86 and openings 88 that expose portions of dielectric layer 82. Masking structure 84 is also referred to as a mask or an etch mask.

Referring now to FIG. 8, the exposed portions of dielectric layer 82 are anisotropically etched to expose portions of barrier height adjustment layer 56, i.e., to expose portions of epitaxial layer 20 and selectively grown epitaxial layers 50, leaving portions 90 that serve as Schottky control structures. Schottky control structures 90 control the P-type Schottky devices by controlling the amount of selectively grown epitaxial layers 50 that becomes silicided. Increasing or decreasing the area of selectively grown epitaxial layers 50 that is silicided modulates the surface electric field and the current carrying capability of Schottky diode 80. A layer of refractory metal (not shown) is deposited over the exposed portions of barrier height adjustment layers 56 and over Schottky control structures 90. By way of example, the refractory metal is titanium having a thickness ranging from about 100 Å to about 1,000 Å. The portions of silicon or polysilicon that are in contact with the refractory metal are converted to silicide using techniques such as those described above with reference to FIG. 4. Thus, titanium silicide layers 92 are formed from the exposed portions of epitaxial layer 20 and selectively grown epitaxial layers 50, i.e., titanium silicide layers 92 are formed from the portions of epitaxial layer 20 in which barrier height adjustment layer 56 has been formed.

A barrier metal layer 60 is formed in contact with silicide layers 92 and Schottky control structures 90 and a metal layer 62 is formed in contact with barrier metal layer 60. Silicide layers 92, barrier metal layer 60, and metal layer 62 form an anode or anode contact 94. A conductor 66 is formed in contact with surface 16 and serves as a cathode or cathode contact for Schottky diode 80. Suitable metallization systems for conductor 66, barrier metal layer 60, and metal layer 62 have been described above.

Schottky diode 80 has a superjunction comprising epitaxial layer 20 and selectively grown epitaxial layers 50 in which the charge in these regions is balanced as between each other. Balancing the charge in these regions provides a low resistance current path for current flow from the anode to the cathode, which lowers the forward voltage drop of Schottky diode 80.

FIG. 9 is a cross-sectional view of a semiconductor component 85 in accordance with another embodiment of the present invention. By way of example, semiconductor component 85 is a Schottky diode. It should be noted that semiconductor component 85 is similar to semiconductor component 80 except that it includes a layer of intrinsic or undoped silicon 76 on the sidewalls and floors of trenches 40. Undoped silicon layer 76 may be formed as described above with reference to FIG. 6 for manufacturing semiconductor component 75. Like semiconductor component 75, semiconductor component 85 includes selectively grown epitaxial layers 50A, barrier height adjustment layer 56, and cathode contact 66. In addition, Schottky diode 85 includes Schottky control structures 90 which were described above with reference to FIG. 8 and an anode contact 94.

Schottky diode 85 has a superjunction comprising epitaxial layer 20 and selectively grown epitaxial layers 50A in which the charge in these regions is balanced as between each other. Balancing the charge in these regions provides a low resistance current path for current flow from the anode to the cathode, which lowers the forward voltage drop of Schottky diode 85. Schottky diode 85 further includes compensation inhibition layers 76 that inhibit the compensation of dopants between N conductivity type epitaxial layer 20 and P conductivity type selectively grown epitaxial layers 50A.

FIG. 10 is a cross-sectional view of a semiconductor component 100 in accordance with another embodiment of the present invention. It should be noted that the processing steps described with reference to FIGS. 1 and 2 for manufacturing semiconductor component 10 may be the same as those for manufacturing semiconductor component 100. Thus, the description of FIG. 10 continues from the description of FIG. 2. What is shown in FIG. 10 is semiconductor material 12 having trenches 40 extending into epitaxial layer 20 and selectively grown epitaxial layers 50. A layer of dielectric material 102 having a thickness ranging from about 1,000 Å to about 1,500 Å is formed on or from epitaxial layer 20 and selectively grown epitaxial layers 50. By way of example, dielectric layer 102 is formed by thermal oxidation. The method and materials for forming dielectric layer 102 are not limitations of the present invention. For example, dielectric layer 102 may be a TEOS layer, a silicon nitride layer, or the like.

Referring now to FIG. 11, dielectric layer 102 is removed from surfaces 14 and 52 of epitaxial layer 20 and selectively grown epitaxial layers 50, respectively, using for example an isotropic etch. The etch leaves portions 104 of dielectric layer 102 in trenches 40 and exposes portions 51 of selectively grown epitaxial layers 50. Portions 102 serve as dielectric liners.

Referring now to FIG. 12, a layer of silicon (not shown) is epitaxially grown on the exposed portions of epitaxial layer 20, portions 51 and surfaces 52 of selectively grown epitaxial layers 50, and dielectric liners 104. The epitaxial silicon layer seals trenches 40 forming sealed cavities 108. Preferably, sealed cavities 108 are vacuum sealed cavities and may be referred to as voids. The material of the epitaxial silicon layer is referred to as a sealing material. The material for the epitaxial layer is not a limitation of the present invention. The epitaxial layer is planarized leaving portions 110 that seal cavities 108. Techniques for planarizing an epitaxial layer are known to those skilled in the art. Portions 110 are referred to as sealing caps or sealing plugs. Portions of epitaxial layer 20, selectively grown epitaxial layers 50, and sealing plugs 110 are doped with an impurity material of P-type conductivity such as, for example, boron or indium to form a barrier height adjustment region or layer 56. Techniques for forming barrier height adjustment layer 56 have been described above. It should be noted that barrier height adjustment layer 56 extends into the silicon epitaxial material of sealing caps 110 and into epitaxial layer 20 and selectively grown epitaxial layers 50. For the sake of clarity, vertical lines 111 are included to distinguish the location of the epitaxial material for sealing caps 110 from barrier height adjustment layer 56. Thus, the regions between two adjacent vertical lines 111 that are above trenches 40 are portions of sealing plugs 110. A layer of dielectric material 112 such as, for example, oxide, is formed over epitaxial layer 20, surfaces 52 of selectively grown epitaxial layers 50, and sealing plugs 110. By way of example, dielectric layer 112 has a thickness ranging from about 0.5 μm to about 1.5 μm. A layer of photoresist is patterned over dielectric layer 112 to form a masking structure 114 having masking features 116 and openings 118 that expose portions of dielectric layer 112. Masking structure 114 is also referred to as a mask or an etch mask.

Referring now to FIG. 13, the portions of dielectric layer 112 exposed by openings 118 are anisotropically etched to expose portions of epitaxial layer 20 and selectively grown epitaxial layers 50 that have barrier height adjustment layer 56. After etching dielectric layer 112, portions 115 of dielectric layer 112 remain and are referred to as Schottky control structures. The structure and function of Schottky control structures 115 are similar to Schottky control structures 90 described above with reference to FIG. 8. Masking structure 114 is removed. A layer of refractory metal (not shown) is deposited over the exposed portions of epitaxial layer 20 having barrier height adjustment layer 56 and selectively grown epitaxial layers 50 and over Schottky control structures 115. By way of example, the refractory metal is titanium having a thickness ranging from about 100 Å to about 1,000 Å. Silicide is formed from the layer of refractory material using techniques that have been described above. Thus, titanium silicide layers 117 are formed from the exposed portions of epitaxial layer 20 and selectively grown epitaxial layers 50, i.e., from portions of barrier height adjustment layer 56 that are formed from epitaxial layer 20 and selectively grown epitaxial layers 50. It should be noted that the type of refractory metal is not a limitation of the present invention. However, the current carrying capability of Schottky diode 100 may be selected in part by the type of silicide that is formed. A barrier metal layer 60 is formed in contact with silicide layers 117 and Schottky control structures 115 and a metal layer 62 is formed in contact with barrier metal layer 60. Silicide layers 117, barrier metal layer 60, and metal layer 62 form an anode or anode contact 118. A conductor 66 is formed in contact with surface 16 and serves as a cathode or cathode contact for Schottky diode 100. Suitable metallization systems for conductor 66, barrier metal layer 60, and metal layer 62 have been described above.

Schottky diode 100 has a superjunction comprising epitaxial layer 20 and selectively grown epitaxial layers 50 in which the charge in these regions is balanced as between each other. Balancing the charge in these regions provides a low resistance current path for current flow from the anode to the cathode, which lowers the forward voltage drop of Schottky diode 100. Schottky diode 100 further includes air gaps 108 that lower the capacitance of the Schottky diode and increase its speed.

FIG. 14 is a cross-sectional view of a semiconductor component 105 such as, for example, a Schottky diode, in accordance with another embodiment of the present invention. It should be noted that semiconductor component 105 is similar to semiconductor component 100 except that it includes a layer of undoped silicon 76 on the sidewalls and floors of trenches 40. Undoped silicon layer 76 may be formed as described above with reference to semiconductor component 75 of FIG. 6. Like semiconductor component 100, semiconductor component 105 includes Schottky control structures 115, barrier height adjustment layer 56, anode contact 118, and cathode contact 66. Because the selectively grown epitaxial layers are formed on intrinsic silicon layers 76, they are identified by reference character 50A.

Schottky diode 105 has a superjunction comprising epitaxial layer 20 and selectively grown epitaxial layers 50A in which the charge in these regions is balanced as between each other. Balancing the charge in these regions provides a low resistance current path for current flow from the anode to the cathode, which lowers the forward voltage drop of Schottky diode 105. Schottky diode 105 further includes air gaps 108 that lower the capacitance of Schottky diode 105 and increase its speed. Schottky diode 105 further includes compensation inhibition layers 76 that inhibit charge compensation due to the outdiffusion of dopants from selectively grown epitaxial layers 50A. As discussed above, charge balance is maintained in the presence of compensation, however the compensation decreases the overall charge figure of merit.

FIG. 15 is a cross-sectional view of a semiconductor component such as, for example, a Schottky diode 130 in accordance with another embodiment of the invention. Semiconductor component 130 is similar to semiconductor component 100 except that Schottky control structures 115 are absent from semiconductor component 130. What is shown in FIG. 15 is semiconductor material 12 having trenches 40 extending into epitaxial layer 20, barrier height adjustment layer 56, selectively grown epitaxial layers 50, dielectric liners 104, sealed cavities 108, and sealing caps 110. It should be noted that barrier height adjustment region 56 extends into sealing caps 110; however, for the sake of clarity the dopant of barrier height adjustment layer 56 is not shown in sealing caps 110. A layer of refractory metal (not shown) is deposited over the exposed portions of epitaxial layer 20, over selectively grown epitaxial layers 50, and over sealing caps 110. By way of example, the refractory metal is titanium having a thickness ranging from about 100 Å to about 1,000 Å. Formation of silicide from a refractory metal and silicon or polysilicon has been described above. A titanium silicide layer 132 is formed from the exposed portions of epitaxial layer 20, selectively grown epitaxial layers 50, and from sealing caps 110. A barrier metal layer 60 is formed in contact with silicide layer 132 and a metal layer 62 is formed in contact with barrier metal layer 60. Silicide layer 132, barrier metal layer 60, and metal layer 62 form an anode or anode contact 134. A conductor 66 is formed in contact with surface 16 and serves as a cathode or cathode contact for Schottky diode 130. Suitable metallization systems for conductor 66, barrier metal layer 60, and metal layer 62 have been described above.

Schottky diode 130 has a superjunction comprising epitaxial layer 20 and selectively grown epitaxial layers 50 in which the charge in these regions is balanced as between each other. Balancing the charge in these regions provides a low resistance current path for current flow from the anode to the cathode, which lowers the forward voltage drop of Schottky diode 130. Schottky diode 130 further includes air gaps 108 that lower the capacitance of Schottky diode 130 and increase its speed.

FIG. 16 is a cross-sectional view of a semiconductor component such as, for example, a Schottky diode 135 in accordance with another embodiment of the present invention. It should be noted that Schottky diode 135 is similar to Schottky diode 130 except that it includes a layer of undoped silicon 76 on the sidewalls and floors of trenches 40. Like Schottky diode 75 of FIG. 6, Schottky diode 135 includes selectively grown epitaxial layers 50A formed over undoped silicon layers 76. Undoped silicon layers 76 may be formed using techniques described above with reference to FIG. 6. Like Schottky diode 130, Schottky diode 135 includes barrier height adjustment layer 56, sealing caps 110, sealed cavities 108, anode contact 134, and cathode contact 66.

Schottky diode 135 has a superjunction comprising epitaxial layer 20 and selectively grown epitaxial layers 50A in which the charge in these regions is balanced as between each other. Balancing the charge in these regions provides a low resistance current path for current flow from the anode to the cathode, which lowers the forward voltage drop of Schottky diode 135. Schottky diode 135 further includes compensation inhibition layers 76 that inhibit charge compensation due to the outdiffusion of dopants from selectively grown epitaxial layers 50A. As discussed above, charge balance is maintained in the presence of compensation, however the compensation decreases the overall charge figure of merit. Schottky diode 135 also includes air gaps 108 that lower the capacitance of Schottky diode 135 and increase its speed.

FIG. 17 is a cross-sectional view of a semiconductor component such as, for example, a Schottky diode 140 in accordance with another embodiment of the present invention. Schottky diode 140 is similar to Schottky diode 130 except that the trenches extend into semiconductor substrate 18. What is shown in FIG. 17 is semiconductor material 12 having trenches 40B extending into epitaxial layer 20, barrier height adjustment layer 56, selectively grown epitaxial layers 50B, dielectric liners 104B, sealed cavities 108B, sealing caps 110, silicide layer 132, barrier metal layer 60, metal layer 62, and conductor 66. Like Schottky diode 130, the barrier height adjustment region extends into sealing caps 110; however, for the sake of clarity the dopant of barrier height adjustment layer 56 is not shown in sealing caps 110. The trenches of semiconductor component 140 are formed in a similar manner as trenches 40 of semiconductor component 130 except that the trenches of semiconductor component 140 extend further into semiconductor material 12 than trenches 40 extend into semiconductor material 12. Similarly, selectively grown epitaxial layers 50B, dielectric liners 104B, and sealed cavities 108B of semiconductor component 140 extend further into semiconductor material 12 than selectively grown epitaxial layers 50, dielectric liners 104 and sealed cavities 108 of semiconductor component 130 extend into semiconductor material 12. Thus, reference character "B" has been appended to reference characters 40, 50, 104, and 108 to distinguish between the trenches, selectively grown epitaxial layers, dielectric liners, and sealed cavities of semiconductor components 130 and 140. Accordingly, the trenches of semiconductor component 130 are identified by reference character 40, the selectively grown epitaxial layers of semiconductor component 130 are identified by reference character 50, the dielectric liners of semiconductor component 130 are identified by reference character 104, and the sealed cavities of semiconductor component 130 are identified by reference character 108, whereas the trenches of semiconductor component 140 are identified by reference character 40B, the selectively grown epitaxial layers of semiconductor component 140 are identified by reference character 50B, the dielectric liners of semiconductor component 140 are identified by reference character 104B, and the sealed cavities of semiconductor component 140 are identified by reference character 108B.

Schottky diode 140 has a superjunction comprising epitaxial layer 20 and selectively grown epitaxial layers 50B in which the charge in these regions is balanced as between each other. Balancing the charge in these regions provides a low resistance current path for current flow from the anode to the cathode, which lowers the forward voltage drop of Schottky diode 140. Schottky diode 140 further includes air gaps 108B that lower the capacitance of Schottky diode 140 and increase its speed. In addition, extending trenches 40B to semiconductor substrate 18 increases the breakdown voltage of Schottky diode 140.

FIG. 18 is a cross-sectional view of a semiconductor component such as for example, a Schottky diode 145 in accordance with another embodiment of the present invention. It should be noted that semiconductor component 145 is similar to semiconductor component 140 except that it includes a layer of undoped silicon 76B on the sidewalls and floors of trenches 40B. Undoped silicon layer 76B may be formed in a manner similar to the formation of undoped silicon layer 76 described above with reference to FIG. 6. Like Schottky diode 140, Schottky diode 145 includes selectively grown epitaxial layers 50B, barrier control region or layer 56, sealing caps 110, dielectric liners 104B, sealed cavities 108B, anode contact 134, and cathode contact 66.

Schottky diode 145 has a superjunction comprising epitaxial layer 20 and selectively grown epitaxial layers 50B in which the charge in these regions is balanced as between each other. Balancing the charge in these regions provides a low resistance current path for current flow from the anode to the cathode, which lowers the forward voltage drop of Schottky diode 140. Schottky diode 140 further includes a dielectric liner 104B and air gaps 108B that lower the capacitance of Schottky diode 140. In addition, extending trenches 40B to semiconductor substrate 18 increases the breakdown voltage of Schottky diode 140. Because the dopant concentration of semiconductor substrate 18 is so much greater than those of selectively grown epitaxial layers 50B and selectively grown undoped silicon layers 76B, the portions of selectively grown epitaxial layers 50B and selectively grown undoped silicon layers 76B in semiconductor substrate 18 become, in essence, a portion of semiconductor substrate 18.

FIG. 19 is a cross-sectional view of a semiconductor component 150 in accordance with another embodiment of the present invention. It should be noted that the processing steps described with reference to FIG. 1 for manufacturing semiconductor component 10 may be the same as those for manufacturing semiconductor component 150. Thus, the description of FIG. 14 continues from the description of FIG. 1. Trenches 40 having sidewalls 42 and floors 44 are formed in epitaxial layer 20 as described with reference to FIG. 2.

Layers of epitaxial material 152 having the same conductivity type as epitaxial layer 20 are selectively grown along sidewalls 42 and floors 44 of trenches 40. Selectively grown epitaxial layers 152 have top surfaces 154 that are substantially planar with surface 14. Epitaxial layers 152 are referred to as selectively grown epitaxial layers. In accordance with an embodiment of the present invention, selectively grown epitaxial layers 152 are of N-type conductivity and have a dopant concentration ranging from about $1\times10^{16}$ atoms/cm$^3$ to about $5\times10^{16}$ atoms/cm$^3$. Preferably, the dopant concentration of selectively grown epitaxial layers 152 are substantially greater than the dopant concentration of epitaxial layer 20. For example, the dopant concentration of epitaxial layer 20 may range from about $1\times10^{13}$ atoms/cm$^3$ to about $1\times10^{14}$ atoms/cm$^3$ when the dopant concentrations of selectively grown epitaxial layers 152 ranges from about $1\times10^{16}$ atoms/cm$^3$ to about $5\times10^{16}$ atoms/cm$^3$.

Layers of epitaxial material 156 having the opposite conductivity type as epitaxial layer 20 and selectively grown epitaxial layers 152 are selectively grown on selectively grown epitaxial layers 152. Epitaxial layers 156 are also referred to as selectively grown epitaxial layers. Selectively grown epitaxial layers 156 have top surfaces 158 that are substantially planar with surface 14 and surfaces 154. Preferably, the dopant concentration of selectively grown epitaxial layer 156 is substantially the same as the dopant concentration of selectively grown epitaxial layers 152 when selectively grown epitaxial layers 152 and 156 have the same thickness. For example, when the thicknesses of selectively grown epitaxial layers 152 and 156 is 1 μm and their dopant concentrations are $1\times10^{16}$ atoms/cm$^3$, each of selectively grown epitaxial layers 152 and 156 have a charge figure of merit of $1\times10^{12}$ atoms/cm$^2$. Thus, setting the dopant concentration and the thicknesses of selectively grown epitaxial layers 152 and 156 to be substantially the same preserves charge balance between them. It should be noted that charge balancing can be maintained when selectively grown epitaxial layers 152 and 156 have different dopant concentrations by adjusting their thicknesses in accordance with the relationship that the charge figure of merit is the product of the dopant concentration and the thickness for a uniformly doped material. Likewise, charge balancing can be maintained when selectively grown epitaxial layers 152 and 156 have different thicknesses by adjusting their dopant concentrations in accordance with the relationship that the charge figure of merit is the product of the dopant concentration and the thickness for a uniformly doped material. To further retain charge balance, the dopant concentration of epitaxial layer 20 is much less than the dopant concentrations of selectively grown epitaxial layers 152 and 156.

Although it is preferable that layers 152 and 156 be selectively grown epitaxial layers, this is not a limitation of the present invention. An advantage of selectively growing epitaxial layers 152 and 156 is that the layers can be thin and of substantially constant doping levels or dopant concentration. In addition, selectively growing the epitaxial layers allows for the formation of thinner layers, which decreases the sizes of the Schottky diodes and the amount of outdiffusion from selectively grown epitaxial layers 152 into epitaxial layer 20, which outdiffusion would increase the sizes of the Schottky diode.

Referring now to FIG. 20, dielectric layers 26, 28, and 29 are removed using techniques known to those skilled in the art. A material is formed over epitaxial layer 20 and selectively grown epitaxial layers 152 and 156 and overfills trenches 40. Preferably, the material is a dielectric material such as, for example, oxide. Techniques for forming oxide in trenches are known to those skilled in the art. The dielectric material is planarized using, for example, chemical mechanical planarization ("CMP"). Planarizing the dielectric material leaves portions 72 in trenches 40. Portions 72 are referred to as oxide plugs, dielectric plugs, capacitance modulation structures, or the like. It should be noted that plugs 72 are comprised of a dielectric material to limit outdiffusion from selectively grown epitaxial layer 156 and thereby maintain charge balance between selectively grown epitaxial layers 152 and 156. Portions of epitaxial layer 20, selectively grown epitaxial layers 152 and 156, and oxide plugs 72 are doped with an impurity material of P-type conductivity such as, for example, boron or indium to form barrier height adjustment regions or layers 56. By way of example, barrier height adjustment layers 56 are formed by implanting the impurity material into epitaxial layer 20, selectively grown epitaxial layers 152 and 154, and oxide plugs 72. For the sake of clarity, the impurity material of barrier height adjustment layers 56 are not shown in oxide plugs 72. However, it should be understood that the dopant material of barrier height adjustment layers 56 is also formed in oxide plugs 72. Selectively grown epitaxial layers 152 and 156 and epitaxial layer 20 are annealed using a rapid thermal anneal technique.

Referring now to FIG. 21, a layer of refractory metal (not shown) is deposited over epitaxial layer 20, selectively grown epitaxial layers 152 and 156, and oxide plugs 72. By way of example, the refractory metal is titanium having a thickness ranging from about 100 Å to about 1,000 Å. Silicide is formed from the refractory metal and the silicon of epitaxial layer 20 using techniques described above. Thus, titanium silicide layers 160 are formed from epitaxial layer 20 and selectively grown epitaxial layers 152 and 156.

A barrier metal layer 60 is formed in contact with titanium silicide layers 160 and oxide plugs 72. Suitable materials for barrier metal layer 60 include titanium nitride, titanium, tungsten, platinum, or the like. A metal layer 62 is formed in contact with barrier metal layer 60. Suitable materials for metal layer 62 include aluminum, nickel, silver, or the like. Silicide layer 160, barrier metal layer 60, and metal layer 62 form an anode or anode contact 162 of Schottky diode 150. A conductor 66 is formed in contact with surface 16 and serves as a cathode or cathode contact for Schottky diode 150. Suitable metallization systems for conductor 66 have been described above.

Schottky diode 150 has a superjunction comprising selectively grown epitaxial layers 152 and 156 in which the charge in these regions is balanced as between each other. Balancing the charge in these regions provides a low resistance current path for current flow from the anode to the cathode, which lowers the forward voltage drop of Schottky diode 150.

FIG. 22 is a cross-sectional view of a semiconductor component 155 such as, for example, a Schottky diode in accordance with another embodiment of the present invention. It should be noted that Schottky diode 155 is similar to Schottky diode 150 except that it includes a layer of undoped silicon 76 on the sidewalls and floors of trenches 40. In addition, Schottky diode 155 includes a layer of undoped silicon 76C between selectively grown epitaxial layers 152A and 156A. Undoped silicon layer 76C may be formed in a manner similar to the formation of undoped silicon layer 76 described above with reference to FIG. 6. Like Schottky diode 150, Schottky diode 155 includes trenches 40, oxide plugs 72, silicide layers 160, barrier metal layer 60, and metal layer 62. Selectively grown epitaxial layers 152A are similar to selectively grown epitaxial layers 152 except that they are formed on undoped silicon layers 76 rather than on sidewalls 42 and floors 44 of trenches 40 and selectively grown epitaxial layers 156A are similar to selectively grown epitaxial layers 156 except that they are grown on undoped silicon layers 76C. Thus the description for the formation and dopant concentrations of selectively grown epitaxial layers 152 and 156 applies to the formation of selectively grown epitaxial layers 152A and 156A. Similarly, the dopant concentration of epitaxial layer 20 of semiconductor component 150 applies to semiconductor component 155. Intrinsic silicon layers 76 help preserve the desired charge balance by inhibiting compensation due to the outdiffusion of dopants from selectively grown epitaxial layers 152A into epitaxial layer 20 and intrinsic silicon layers 76C help preserve the desired charge balance by inhibiting compensation due to the outdiffusion of dopants from selectively grown epitaxial layers 152A and 156A into each other.

Schottky diode 155 has a superjunction comprising selectively grown epitaxial layers 152A and 156A in which the charge in these regions is balanced as between each other. Balancing the charge in these regions provides a low resistance current path for current flow from the anode to the cathode, which lowers the forward voltage drop of Schottky diode 155. Schottky diode 155 further includes intrinsic silicon liners 76 and 76C which further inhibit compensation due to the outdiffusion of dopants from Schottky diode 155. It should be noted that although charge balance is maintained when compensation occurs, compensation lowers the level of charge as indicated by a lower charge figure of merit. Thus, inhibiting compensation retains or preserves the desired level of charge being balanced.

FIG. 23 is a cross-sectional view of a semiconductor component 170 such as, for example a Schottky diode, in accordance with another embodiment of the present invention. It should be noted that the processing steps described with reference to FIGS. 19 and 20 for manufacturing semiconductor component 150 may be the same as those for manufacturing semiconductor component 170. Thus, the description of FIG. 23 continues from the description of FIG. 20. What is shown in FIG. 23 is semiconductor material 12 having trenches 40 extending into epitaxial layer 20, selectively grown epitaxial layers 152 and 156, dielectric plugs 72, and barrier height adjustment layers 56. A layer of dielectric material 172 having a thickness ranging from about 0.5 µm to about 1.5 µm is formed on epitaxial layer 20, selectively grown epitaxial layers 152 and 156, and dielectric plugs 72. By way of example, dielectric layer 172 is a TEOS layer. A layer of photoresist is patterned over dielectric layer 172 to form a masking structure 174 having masking elements 176 and openings 178 that expose portions of dielectric layer 172. Masking structure 174 is also referred to as a mask or an etch mask.

Referring now to FIG. 24, the exposed portions of dielectric layer 172 are anisotropically etched to expose portions of epitaxial layer 20 and selectively grown epitaxial layers 152 and 156 and leaving portions 180 that serve as Schottky control structures. Schottky control structures 180 control the P-type Schottky devices by controlling the area of selectively grown epitaxial layers 156 that becomes silicided. Increasing the area of selectively grown epitaxial layers 152 that is silicided, i.e., making Schottky control structures 180 smaller, decreases the surface electric field and increases the current carrying capability of Schottky diode 170. Alternatively, decreasing the area of selectively grown epitaxial layers 152 that is silicided, i.e., making Schottky control structures 180 larger, increases the surface electric field and decreases the current carrying capability of Schottky diode 170. A layer of refractory metal (not shown) is deposited over the exposed portions of epitaxial layer 20 and over Schottky control structures 180. By way of example, the refractory metal is titanium having a thickness ranging from about 100 Å to about 1,000 Å. Silicide is formed from the refractory metal and the silicon or polysilicon using techniques described above. Thus, titanium silicide layers 182 are formed from the exposed portions of epitaxial layer 20 and selectively grown epitaxial layers 152 and 156.

A barrier metal layer 60 is formed in contact with silicide layers 182 and Schottky control structures 180, and a metal layer 62 is formed in contact with barrier metal layer 60. Silicide layers 182, barrier metal layer 60, and metal layer 62 form an anode or anode contact 184. A conductor 66 is formed in contact with surface 16 and serves as a cathode or cathode contact for Schottky diode 170. Suitable metallization systems for conductor 66, barrier metal layer 60, and metal layer 62 have been described above.

Schottky diode 170 has a superjunction comprising selectively grown epitaxial layers 152 and 156 in which the charge in these regions is balanced as between each other. Balancing the charge in these regions provides a low resistance current path for current flow from the anode to the cathode, which lowers the forward voltage drop of Schottky diode 170.

FIG. 25 is a cross-sectional view of a semiconductor component 175 such as, for example, a Schottky diode in accordance with another embodiment of the present invention. It should be noted that Schottky diode 175 is similar to Schottky diode 170 except that it includes a layer of intrinsic or undoped silicon 76 on the sidewalls and floors of trenches 40. In addition, Schottky diode 175 includes a layer of intrinsic or undoped silicon 76C between selectively grown epitaxial layers 152A and 156A. Undoped silicon layer 76C may be formed in a manner similar to the formation of intrinsic or undoped silicon layer 76 described above with reference to FIG. 6. Like Schottky diode 170, Schottky diode 175 includes trenches 40, oxide plugs 72, silicide layers 182, barrier metal layer 60, and metal layer 62. Selectively grown epitaxial layers 152A are similar to selectively grown epitaxial layers 152 except that they are formed on intrinsic or undoped silicon layers 76 rather than on sidewalls 42 and floors 44 of trenches 40 and selectively grown epitaxial layers 156A are similar to selectively grown epitaxial layers 156 except that they are grown on intrinsic or undoped silicon layers 76C. Thus the description for the formation and dopant concentrations of selectively grown epitaxial layers 152 and 156 applies to the formation of selectively grown epitaxial layers 152A and 156A. Similarly, the dopant concentration of epitaxial layer 20 of semiconductor component 150 applies to semiconductor component 175 Intrinsic silicon layers 76 help preserve charge balance by inhibiting outdiffusion of dopants from selectively grown epitaxial layers 152A into epitaxial layer 20 and intrinsic silicon layers 76C help preserve charge balance by inhibiting outdiffusion of dopants from selectively grown epitaxial layers 152A and 156A into each other.

Schottky diode 175 has a superjunction comprising selectively grown epitaxial layers 152A and 156A in which the charge in these regions is balanced as between each other. Balancing the charge in these regions provides a low resistance current path for current flow from the anode to the cathode, which lowers the forward voltage drop of Schottky diode 175. Schottky diode 175 further includes intrinsic or undoped silicon liners 76 and 76C which further inhibit compensation due to the outdiffusion of dopants from Schottky diode 175. As discussed above, although charge balance is maintained when compensation occurs, compensation lowers the level of charge as indicated by the lower charge figure of merit. Thus, inhibiting compensation retains or preserves the desired level of charge being balanced.

FIG. 26 is a cross-sectional view of a semiconductor component 200 in accordance with another embodiment of the present invention. It should be noted that the processing steps described with reference to FIGS. 19 and 20 for manufacturing semiconductor component 200 may be the same as those for manufacturing semiconductor component 150. Thus, the description of FIG. 26 continues from the description of FIG. 20. What is shown in FIG. 26 is semiconductor material 12 having trenches 40 extending into epitaxial layer 20 and selectively grown epitaxial layers 152 and 156. Oxide liners 104 are formed along selectively grown epitaxial layers 156 and sealing caps or plugs 110 and sealed cavities 108 are formed in trenches 40. Barrier height adjustment regions or layers 56 are formed in epitaxial layer 20, selectively grown epitaxial layers 152 and 156, and sealing caps 110. The dopant concentration of selectively grown epitaxial layers 152 and 156 are substantially greater than the dopant concentration of epitaxial layer 20. It should be noted that barrier height adjustment regions 56 extend into sealing caps 110; however, for the sake of clarity the dopant of barrier height adjustment layers 56 is not shown in sealing caps 110. Methods for forming oxide liners 104, sealing caps 110, sealed cavities 108, and barrier height adjustment layers 56 are described above.

Schottky control structures 115 are formed over sealing caps 110 and portions of selectively grown epitaxial layers 156 and silicide layers 117 are formed from portions of epitaxial layer 20 and portions of selectively grown epitaxial layers 156. Methods for forming Schottky control structures 115 and silicide layers 117 are described with reference to FIG. 13. A barrier metal layer 60 is formed in contact with silicide layers 117 and Schottky control structures 115 and a metal layer 62 is formed in contact with barrier metal layer 60. Silicide layers 117, barrier metal layer 60, and metal layer 62 form an anode or anode contact 202. A conductor 66 is formed in contact with surface 16 and serves as a cathode or cathode contact for Schottky diode 200. Suitable metallization systems for conductor 66, barrier metal layer 60, and metal layer 62 have been described above.

Schottky diode 200 has a superjunction comprising selectively grown epitaxial layers 152 and 156 in which the charge in these regions is balanced as between each other. Balancing the charge in these regions provides a low resistance current path for current flow from the anode to the cathode, which lowers the forward voltage drop of Schottky diode 200. Schottky diode 200 further includes air gaps 108 that lower the capacitance of Schottky diode 200 and increase its speed.

FIG. 27 is a cross-sectional view of a semiconductor component 205 such as, for example, a Schottky diode in accordance with another embodiment of the present invention. It should be noted that Schottky diode 205 is similar to Schottky diode 200 except that it includes a layer of intrinsic or undoped silicon 76 on the sidewalls and floors of trenches 40. In addition, Schottky diode 205 includes a layer of intrinsic or undoped silicon 76C between selectively grown epitaxial layers 152A and 156A. Undoped silicon layer 76C may be formed in a manner similar to the formation of undoped silicon layer 76 described above with reference to FIG. 6. Like Schottky diode 200, Schottky diode 205 includes trenches 40, sealed cavities 108, sealing caps 110, silicide layers 117, barrier metal layer 60, and metal layer 62. Selectively grown epitaxial layers 152A are similar to selectively grown epitaxial layers 152 except that they are formed on undoped silicon layers 76 rather than on sidewalls 42 and floors 44 (shown in FIG. 6) of trenches 40 and selectively grown epitaxial layers 156A are similar to selectively grown epitaxial layers 156 except that they are grown on undoped silicon layers 76C. Thus, the description for the formation and dopant concentrations of selectively grown epitaxial layers 152 and 156 applies to the formation of selectively grown epitaxial layers 152A and 156A. The dopant concentration of selectively grown epitaxial layers 152A and 156A are substantially greater than the dopant concentration of epitaxial layer 20. Intrinsic silicon layers 76 help preserve charge balance by inhibiting charge compensation due to the outdiffusion of dopants from selectively grown epitaxial layers 152A into epitaxial layer 20 and intrinsic silicon layers 76C help preserve charge balance by inhibiting charge compensation due to the outdiffusion of dopants from selectively grown epitaxial layers 152A and 156A into each other.

Schottky diode 205 has a superjunction comprising selectively grown epitaxial layers 152A and 156A in which the charge in these regions is balanced as between each other. Balancing the charge in these regions provides a low resistance current path for current flow from the anode to the cathode, which lowers the forward voltage drop of Schottky diode 205. Schottky diode 205 includes intrinsic or undoped silicon liners 76 and 76C which further inhibit compensation due to the outdiffusion of dopants from selectively grown epitaxial layers 152A and 156A. As discussed above, although charge balance is maintained when compensation occurs, compensation lowers the level of charge as indicated by the charge figure of merit. Thus, inhibiting compensation retains or preserves the desired level of charge being balanced.

FIG. 28 is a cross-sectional view of a semiconductor component 210 in accordance with another embodiment of the present invention. The processing steps for manufacturing semiconductor component 210 are similar to those for manufacturing semiconductor component 200 except that Schottky control structures 115 are absent from semiconductor component 210. What is shown in FIG. 28 is semiconductor material 12 having trenches 40 extending into epitaxial layer 20, selectively grown epitaxial layers 152 and 156, oxide liners 104, sealing caps or plugs 110 and sealed cavities 108 formed in trenches 40. Barrier height adjustment regions or layers 56 are formed in epitaxial layer 20, selectively grown epitaxial layers 152 and 156, and sealing caps 110. Methods for forming oxide liners 104, sealing caps 110, sealed cavities 108, and barrier height adjustment layers 56 have been described above. Barrier height adjustment layer 56 extends into sealing caps 110; however, for the sake of clarity the dopant of barrier height adjustment layer 56 is not shown in sealing caps 110.

A layer of refractory metal (not shown) is deposited over epitaxial layer 20, selectively grown epitaxial layers 152 and 156, and sealing caps 110. By way of example, the refractory metal is titanium having a thickness ranging from about 100 Å to about 1,000 Å. Silicide is formed from the refractory metal and the silicon or polysilicon. Thus, a titanium silicide layer 212 is formed from epitaxial layer 20, selectively grown epitaxial layers 152 and 156, and sealing caps 110. A barrier metal layer 60 is formed in contact with titanium silicide layer 212 and a metal layer 62 is formed in contact with barrier metal layer 60. Silicide layer 212, barrier metal layer 60, and metal layer 62 form an anode or anode contact 214 of Schottky diode 210. A conductor 66 is formed in contact with surface 16 and serves as a cathode or cathode contact for Schottky diode 210. Suitable metallization systems for barrier metal layer 60, metal layer 62, and cathode 66 have been described above.

Schottky diode 210 has a superjunction comprising selectively grown epitaxial layers 152 and 156 in which the charge in these regions is balanced as between each other. Balancing the charge in these regions provides a low resistance current path for current flow from the anode to the cathode, which lowers the forward voltage drop of Schottky diode 210. Schottky diode 210 further includes air gaps 108 that lower its capacitance and increase its speed.

FIG. 29 is a cross-sectional view of a semiconductor component 215 such as, for example, a Schottky diode in accordance with another embodiment of the present invention. It should be noted that Schottky diode 215 is similar to Schottky diode 210 except that it includes a layer of undoped silicon 76 on the sidewalls and floors of trenches 40. In addition, Schottky diode 215 includes a layer of intrinsic or undoped silicon 76C between selectively grown epitaxial layers 152A and 156A. Undoped silicon layer 76C may be formed in a manner similar to the formation of undoped silicon layer 76 described above with reference to FIG. 6. Like Schottky diode 210, Schottky diode 215 includes trenches 40, sealed cavities 108, sealing caps 110, silicide layer 212, barrier metal layer 60, metal layer 62, anode or anode contact 214, and cathode or cathode contact 66. The formation of selectively grown epitaxial layers 152A and 156A have been described above. The dopant concentration of selectively grown epitaxial layers 152A and 156A are substantially greater than the dopant concentration of epitaxial layer 20. Intrinsic silicon layers 76 help preserve charge balance by inhibiting compensation due to the outdiffusion of dopants from selectively grown epitaxial layers 152A into epitaxial layer 20 and intrinsic silicon layers 76C help preserve charge balance by inhibiting compensation due to the outdiffusion of dopants from selectively grown epitaxial layers 152A and 156A into each other. As discussed above, although charge balance is maintained when compensation occurs, compensation lowers the level of charge as indicated by the charge figure of merit. Thus, inhibiting compensation retains or preserves the desired level of charge being balanced.

Schottky diode 215 has a superjunction comprising selectively grown epitaxial layers 152A and 156A in which the charge in these regions is balanced as between each other. Balancing the charge in these regions provides a low resistance current path for current flow from the anode to the cathode, which lowers the forward voltage drop of Schottky diode 215. Schottky diode 215 includes intrinsic or undoped silicon liners 76 and 76C which further inhibit charge compensation due to the outdiffusion of dopants from selectively grown epitaxial layers 152A and 156A.

FIG. 30 is a cross-sectional view of a semiconductor component such as, for example, a Schottky diode 220 in accordance with another embodiment of the present invention. Schottky diode 220 is similar to Schottky diode 210 except that the trenches extend into semiconductor substrate 18. What is shown in FIG. 30 is semiconductor material 12 having trenches 40B extending into epitaxial layer 20, barrier height adjustment layer 56, selectively grown epitaxial layers 152B and 156B, dielectric liners 104B, sealed cavities 108B, sealing plugs or sealing caps 110, silicide layer 212, barrier metal layer 60, metal layer 62, anode 214, and cathode 66. Like Schottky diode 210, the barrier height adjustment region extends into sealing caps 110; however, for the sake of clarity the dopant of barrier height adjustment layer 56 is not shown in sealing caps 110. The trenches of Schottky diode 220 are formed in a similar manner as trenches 40 of semiconductor component 210; however, the trenches of Schottky diode 220 extend further into semiconductor material 12 than trenches 40 extend into semiconductor material 12. Similarly, selectively grown epitaxial layers 152B and 156B, dielectric liners 104B, and sealed cavities 108B of Schottky diode 220 extend further into semiconductor material 12 than selectively grown epitaxial layers 152A and 156A, dielectric liners 104 and sealed cavities 108 of Schottky diode 130 extend into semiconductor material 12. Thus, reference character "B" has been appended to reference characters 40, 104, 108, 152, and 156 to distinguish between the trenches, selectively grown epitaxial layers, dielectric liners, and sealed cavities of Schottky diode 210. Accordingly, the trenches of Schottky diode 210 are identified by reference character 40, the selectively grown epitaxial layers of Schottky diode 210 are identified by reference characters 152 and 156, the dielectric liners of Schottky diode 210 are identified by reference character 104, and the sealed cavities of Schottky diode 210 are identified by reference character 108, whereas the trenches of Schottky diode 220 are identified by reference character 40B, the selectively grown epitaxial layers of Schottky diode 220 are identified by reference characters 152B and 156B, the dielectric liners of Schottky diode 220 are identified by reference character 104B, and the sealed cavities of Schottky diode 220 are identified by reference character 108B.

Schottky diode 220 has a superjunction comprising selectively grown epitaxial layers 152B and 156B in which the charge in these regions is balanced as between each other. Balancing the charge in these regions provides a low resistance current path for current flow from the anode to the cathode, which lowers the forward voltage drop of Schottky diode 220. Schottky diode 220 further includes a dielectric liner 104B and air gaps 108B which air gaps 108B lower the capacitance of Schottky diode 220 and increase its speed. In addition, extending trenches 40B to semiconductor substrate 18 increases the breakdown voltage of Schottky diode 220. Because the dopant concentration of semiconductor substrate 18 is so much greater than those of selectively grown epitaxial layers 152B and 156B, the portions of selectively grown epitaxial layers 152B and 156B in semiconductor substrate 18 become, in essence, a portion of semiconductor substrate 18. In addition, the dopant concentration of selectively grown epitaxial layers 152B and 156B are substantially greater than the dopant concentration of epitaxial layer 20.

FIG. 31 is a cross-sectional view of a semiconductor component 225 such as, for example, a Schottky diode in accordance with another embodiment of the present invention. It should be noted that Schottky diode 225 is similar to Schottky diode 220 except that it includes a layer of undoped silicon 76B on the sidewalls and floors of trenches 40B. Undoped or intrinsic silicon layer 76B has been described with reference to FIG. 18. In addition, Schottky diode 225 includes a layer of intrinsic or undoped silicon 76D between selectively grown epitaxial layers 152B and 156B. Undoped silicon layer 76D may be formed in a manner similar to the formation of undoped silicon layer 76 described above with reference to FIG. 6. Like Schottky diode 220, Schottky diode 225 includes trenches 40B, sealed cavities 108B, sealing caps 110, silicide layer 212, barrier metal layer 60, metal layer 62, anode 214, and cathode 66. The formation of selectively grown epitaxial layers 152B and 156B have been described above. Intrinsic silicon layers 76B help preserve charge balance by inhibiting outdiffusion of dopants from selectively grown epitaxial layers 152B into epitaxial layer 20 and intrinsic silicon layers 76D help preserve charge balance by inhibiting outdiffusion of dopants from selectively grown epitaxial layers 152B and 156B into each other.

Schottky diode 225 has a superjunction comprising selectively grown epitaxial layers 152B and 156B in which the charge in these regions is balanced as between each other. Balancing the charge in these regions provides a low resistance current path for current flow from the anode to the cathode, which lowers the forward voltage drop of Schottky diode 225. Schottky diode 225 further includes dielectric liners 104B and air gaps 108B which air gaps 108B lower the capacitance of Schottky diode 225 and increase its speed. In addition, extending trenches 40B to semiconductor substrate 18 increases the breakdown voltage of Schottky diode 225. Schottky diode 225 includes intrinsic or undoped silicon liners 76B and 76D which further inhibit compensation due to the outdiffusion of dopants from selectively grown epitaxial layers 152B and 156B. As discussed above, although charge balance is maintained when compensation occurs, compensation lowers the level of charge as indicated by the charge figure of merit. Thus, inhibiting compensation retains or preserves the desired level of charge being balanced.

Like, semiconductor component 220, the dopant concentration of semiconductor substrate 18 is much greater than those of selectively grown epitaxial layers 152B and 156B. Thus, the portions of selectively grown epitaxial layers 152B and 156B and intrinsic liners 76B and 76D in semiconductor substrate 18 become, in essence, a portion of semiconductor substrate 18. In addition, the dopant concentration of selectively grown epitaxial layers 152B and 156B are substantially greater than the dopant concentration of epitaxial layer 20.

FIG. 32 is a cross-sectional view of a portion of a semiconductor component 250 such as for example a junction field effect transistor ("JFET") during manufacture in accordance with another embodiment of the present invention. What is shown in FIG. 32 is a semiconductor material 12 having opposing surfaces 14 and 16. In accordance with an embodiment of the present invention, semiconductor material 12 comprises an epitaxial layer 20 that is disposed on a semiconductor substrate 18. A doped region 252 is formed in epitaxial layer 20 and extends from surface 14 into epitaxial layer 20. In embodiments in which the conductivity type of epitaxial layer 20 is N-type, the conductivity type of doped region 252 is also N-type. By way of example, doped region 252 has a dopant concentration ranging from about $1 \times 10^{18}$ atoms/cm$^3$ to about $1 \times 10^{20}$ atoms/cm$^3$. It should be noted that in embodiments in which the conductivity type of epitaxial layer 20 is P-type, the conductivity type of doped region 252 is also P-type.

A layer of dielectric material 26 is formed on or from epitaxial layer 20, a dielectric layer 28 is formed on dielectric layer 18, a layer of dielectric layer 29 is formed on dielectric layer 18, and a masking structure 34 is formed on dielectric layer 29. Semiconductor material 12, dielectric layers 26, 28, and 29, and masking structure 34 have been described above with reference to FIG. 1.

Referring now to FIG. 33, trenches 40 having sidewalls 42 and floors 44 are formed in epitaxial layer 20 by removing portions of TEOS layer 29, protective layer 28, dielectric layer 26, and epitaxial layer 20. Selectively grown epitaxial layers 50 are formed on sidewalls 42 and floors 44 of trenches 40. Formation of trenches 40 and selectively grown epitaxial layers 50 have been described above with reference to FIG. 2.

Referring now to FIG. 34, a material (not shown) is formed over selectively grown epitaxial layers 50 and epitaxial layer 20. Preferably, the material is oxide that overfills trenches 40. The material is planarized using, for example, chemical mechanical planarization ("CMP"). Planarizing the material leaves portions 254 over selectively grown epitaxial layers 50 in trenches 40.

A titanium silicide layer 256 is formed from selectively grown epitaxial layers 50 and epitaxial layer 20. A barrier layer 258 is formed in contact with titanium silicide layer 256. Suitable materials for barrier layer 258 include titanium nitride, titanium, tungsten, platinum, or the like. A metal layer 260 is formed in contact with barrier layer 258. Suitable materials for metal layer 260 include aluminum, nickel, silver, or the like.

Silicide layer 256 and selectively grown epitaxial layers 50 form a gate contact of JFET 250. Doped regions 252 and portions of epitaxial layer 20 between adjacent trenches 40 form sources of JFET 250. A conductor 262 is formed in contact with surface 16 and serves as a drain contact or conductor of JFET 250. Suitable metallization systems for conductor 262 include a gold alloy, titanium-nickel-gold, titanium-nickel-silver, or the like.

By now it should be appreciated that a semiconductor component such as, for example a Schottky diode or a JFET and methods for manufacturing the semiconductor component have been provided. In accordance with an embodiment of the present invention, the semiconductor component is a Schottky diode comprising an epitaxial layer of N-type conductivity on a semiconductor substrate in which trenches having sidewalls are formed. A selectively grown epitaxial layer of P-type conductivity is grown on the sidewalls of the trenches and the remaining portions of the trenches are filled or partially filled with undoped polysilicon or a dielectric material such as, for example, oxide. An anode contact is made to the portion of the N-type epitaxial layer that is between adjacent trenches and to the portions of the selectively grown epitaxial layers that are formed along the sidewalls of the trenches and a cathode contact is made to the semiconductor substrate. An advantage of this embodiment is that under a forward bias, current flows from the anode to the cathode along a low resistance conduction path thereby providing a low forward voltage drop. Under a reverse bias, the N-type epitaxial layer and the P-type selectively grown epitaxial layers become depleted in both the lateral and vertical directions. At a predesigned anode-to-cathode voltage, the depletion layers pinch off the conductive path to suppress leakage of the Schottky diode at temperatures equal to or greater than room temperature, thereby helping achieve the desired breakdown voltage. In addition, the width of the P-type selectively grown epitaxial layers and the N-type epitaxial layer and their dopant concentrations can be adjusted to obtain a pinch off condition at zero bias and charge balance at the same time to lower the impact of the image force barrier.

The formation of the P-type epitaxially grown layers around the edge of the N-type epitaxial layer reduces the electric field, especially at the surface near the edge of the N-type Schottky diode. This prevents premature breakdown of the Schottky diode, reduces leakage, and enhances the breakdown voltage. Thus, the P-type epitaxially grown layers serve as a guard ring and reduce the surface electric field. Other advantages of Schottky diodes in accordance with embodiments of the present invention are that breakdown voltage of the Schottky diode is scaled by the depth of the trenches and the forward voltage drop has a negative temperature coefficient whereas the breakdown voltage has a positive temperature coefficient. For example, a breakdown voltage of greater than 700 volts can be attained for Schottky diodes having trench depths of about 35 µm and a breakdown voltage of greater than 100 volts can be attained for Schottky diodes having trench depths of about 2 µm.

In accordance with another embodiment of the present invention, the region between adjacent trenches is filled or partially filled with polysilicon of P-type conductivity and a portion of the epitaxial layer between adjacent trenches is doped with an impurity material or dopant of N-type conductivity to form a JFET.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component, comprising:
   a first semiconductor material of a first conductivity type having first and second major surfaces, wherein the first semiconductor material comprises a semiconductor substrate of the first conductivity type and a first dopant concentration having an epitaxial layer formed thereon, the epitaxial layer of the first conductivity type and a second dopant concentration, wherein the second dopant concentration is less than the first dopant concentration;
   a first trench extending from the first major surface into a first portion of the first semiconductor material, the at least one first trench having a sidewall and a floor, wherein a first portion of the first semiconductor material serves as the sidewall and the floor;
   a second trench extending from the first major surface into a second portion of the first semiconductor material, the second trench having a floor and first and second opposing sidewalls, wherein the second sidewall of the first trench is spaced apart from the first sidewall of the second trench by a first lateral distance, and wherein a first figure of merit is a product of the first lateral distance and the second dopant concentration;
   a layer of intrinsic semiconductor material adjacent to and in direct contact with the sidewall and the floor of the first trench and in direct contact with the sidewall and the floor of the second trench, wherein the intrinsic semiconductor material is a separate material from the first semiconductor material and the sidewalls and the floors of the first trench and the second trench are not formed by the layer of intrinsic material, and wherein a first portion of the layer of intrinsic semiconductor material balances charge in a first direction and a second portion of the layer of intrinsic semiconductor material balances charge in a second direction;
  a semiconductor layer on the layer of intrinsic material, wherein a first portion of the semiconductor layer that is adjacent to the sidewall serves to balance charge in the first direction and the second portion of the semiconductor layer serves to balance charge in a second direction; and
  an electrically conductive material in direct contact with the first semiconductor material and the layer of intrinsic semiconductor material;
  further including a capacitance modulation structure adjacent to the sidewall and the floor of the at least one trench, wherein the layer of intrinsic semiconductor material is between the capacitance modulation structure and the first semiconductor material;
  wherein the capacitance modulation structure comprises an air gap;
  further including a third semiconductor material adjacent to the second semiconductor material, wherein the third semiconductor material cooperates with the second semiconductor material to balance the charge with the second semiconductor material and wherein the second semiconductor material is of the first conductivity type and the third semiconductor material is of a second conductivity type; and
  wherein a dopant concentration of the second and third semiconductor materials is at least ten times greater than a dopant concentration of the first semiconductor material.

2. The semiconductor component of claim 1, wherein the capacitance modulation structure comprises one of an undoped semiconductor material or a dielectric material.

3. The semiconductor component of claim 1, further including a sealing cap over the air gap.

4. The semiconductor component of claim 1, wherein the layer of intrinsic semiconductor material is a selectively grown epitaxial layer.

5. The semiconductor component of claim 4, wherein the first portion of the layer of intrinsic semiconductor material cooperates with a portion of the first semiconductor material that is adjacent to the sidewall to balance charge in the first direction and the second portion of the layer of intrinsic semiconductor material cooperates with a portion of the first semiconductor material that is adjacent to the floor to balance charge in the second direction.

6. The semiconductor component of claim 1, further including a capacitance modulation structure adjacent to the sidewall and the floor of the at least one trench.

7. The semiconductor component of claim 1, further including a first intrinsic semiconductor material between the first semiconductor material and the second semiconductor material.

8. The semiconductor component of claim 7, further including a second intrinsic semiconductor material between the second semiconductor material and the third semiconductor material.

9. The semiconductor component of claim 1, further including:
  a doped region of the one of the first or a second conductivity type extending from the first major surface into the first semiconductor material; and
  a metallization system in direct contact with the doped region and at least the layer of intrinsic semiconductor material.

10. The semiconductor component of claim 1, further including a doped region extending from the first major surface into the first semiconductor material.

11. The semiconductor component of claim 1, further including a semiconductor substrate, wherein the first semiconductor material is disposed on the semiconductor substrate, and wherein the at least one trench extends into the semiconductor substrate.

* * * * *